(12) United States Patent
Nam et al.

(10) Patent No.: US 11,848,279 B2
(45) Date of Patent: Dec. 19, 2023

(54) ELECTRONIC DEVICE INCLUDING PRINTED CIRCUIT BOARD HAVING SHIELDING STRUCTURE

(71) Applicant: Samsung Electronics Co., Ltd., Gyeonggi-do (KR)

(72) Inventors: Daehee Nam, Gyeonggi-do (KR); Yanghwan Kim, Gyeonggi-do (KR); Dongkil Choi, Gyeonggi-do (KR); Jeongho Kang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/585,913

(22) Filed: Jan. 27, 2022

(65) Prior Publication Data

US 2022/0223538 A1     Jul. 14, 2022

Related U.S. Application Data

(63) Continuation of application No. PCT/KR2021/019538, filed on Dec. 21, 2021.

(30) Foreign Application Priority Data

Jan. 12, 2021   (KR) .................. 10-2021-0003965

(51) Int. Cl.
*H01L 23/552*      (2006.01)
*H01L 23/498*      (2006.01)
(Continued)

(52) U.S. Cl.
CPC ...... *H01L 23/552* (2013.01); *H01L 23/49822* (2013.01); *H01L 23/49838* (2013.01);
(Continued)

(58) Field of Classification Search
CPC ...... H05K 1/02; H05K 1/0233; H05K 1/0277; H05K 1/11; H05K 1/111–118;
(Continued)

(56) References Cited

U.S. PATENT DOCUMENTS 10,342,131 B1 *   7/2019   Kim ............... H05K 1/115
10,709,043 B2     7/2020   Yun et al.
(Continued)

FOREIGN PATENT DOCUMENTS

JP    5-343820 A    12/1993
JP    2009-111287 A    5/2009
(Continued)

OTHER PUBLICATIONS

International Search Report dated Mar. 30, 2022.
Written Opinion dated Mar. 30, 2022.

*Primary Examiner* — Tuan T Dinh
(74) *Attorney, Agent, or Firm* — Cha & Reiter, LLC

(57) ABSTRACT

Certain embodiments of the disclosure relate to an electronic device including a substrate having a shielding structure. The electronic device may include a first substrate, a second substrate, and a third substrate. The second substrate may include a first metal pattern connected to ground and including multiple first slits formed by removing a portion of the first metal pattern, each of the first slits having a cross shape, a second metal pattern connected to the ground and including multiple second slits formed by removing a portion of the second metal pattern, each of the second slits having the cross shape, and multiple ground vias extending through at least a portion of the second substrate so as to connect the first metal pattern of the first metal layer to the second metal pattern of the second metal layer. Various other embodiments are also disclosed.

20 Claims, 25 Drawing Sheets

(51) Int. Cl.
*H01L 25/065* (2023.01)
*H01L 25/18* (2023.01)

(52) U.S. Cl.
CPC .......... *H01L 25/0657* (2013.01); *H01L 25/18* (2013.01); *H01L 2225/06548* (2013.01); *H01L 2225/06572* (2013.01)

(58) Field of Classification Search
CPC .......... H05K 1/14; H05K 1/141; H05K 1/144; H01L 23/552; H01L 23/498; H01L 23/49822; H01L 23/49838; H01Q 15/00; H01Q 1/52; H01Q 1/523; H01P 1/20; H01P 1/203
USPC ......... 361/770–795, 816, 818; 257/660–690; 333/134, 204
See application file for complete search history.

(56) References Cited

U.S. PATENT DOCUMENTS

| | | | |
|---|---|---|---|
| 2005/0168961 A1* | 8/2005 | Ono | H01L 25/0652 257/E25.011 |
| 2006/0222356 A1* | 10/2006 | Hosota | G03B 9/10 396/89 |
| 2009/0107714 A1 | 4/2009 | Ogasawara | |
| 2011/0031007 A1 | 2/2011 | Kim et al. | |
| 2011/0248800 A1* | 10/2011 | Kushta | H01P 7/04 333/204 |
| 2012/0243195 A1* | 9/2012 | Lim | H05K 1/141 361/784 |
| 2013/0099876 A1* | 4/2013 | Kushta | H01P 1/203 333/204 |
| 2016/0157336 A1* | 6/2016 | Murai | H05K 1/0234 361/782 |
| 2018/0145420 A1* | 5/2018 | Kushta | H01Q 1/523 |
| 2018/0269561 A1 | 9/2018 | Kim et al. | |
| 2019/0082536 A1* | 3/2019 | Park | H05K 1/116 |

FOREIGN PATENT DOCUMENTS

| | | |
|---|---|---|
| KR | 10-1072591 B1 | 10/2011 |
| KR | 10-2017-0094702 A | 8/2017 |
| KR | 10-2018-0105356 A | 9/2018 |
| KR | 10-2020-0032911 A | 3/2020 |

\* cited by examiner

ELECTRONIC DEVICE INCLUDING PRINTED CIRCUIT BOARD HAVING SHIELDING STRUCTURE

CROSS-REFERENCE TO RELATED APPLICATION(S)

This application is a continuation of International Application No. PCT/KR2021/019538, filed on Dec. 21, 2021, which claims priority to Korean Patent Application No. 10-2021-0003965, filed on Jan. 12, 2021 in the Korean Intellectual Property Office, the disclosures of which are herein incorporated by reference.

TECHNICAL FIELD

One or more embodiments of the instant disclosure generally relate to an electronic device including a substrate having a shielding structure.

BACKGROUND ART

Electronic devices have been made slimmer due to user preference and market pressure, and have been developed to have increased rigidity to better protect internal components.

An electronic device may include at least two substrates (for example, printed circuit boards (PCBs)) disposed in the inner space thereof. Theses substrates may be stacked on each other so as to provide an efficient mounting space for other components, and may be electrically connected to each other via a stack-type substrate (for example, interposer) disposed therebetween. For example, substrates may include multiple conductive terminals, and the two substrates may be electrically connected by physical contact via multiple corresponding conductive terminals disposed on corresponding surfaces of the stack-type substrate.

Multiple electronic components need to be mounted on the substrate of the electronic device, and the spaces in which the components are mounted must be used efficiently in order to provide the slimmest possible electronic device. In addition, if multiple electronic components efficiently disposed on the substrate of the electronic device interfere with each other and thus fail to function correctly, the quality of the electronic device may be degraded. Therefore, recent developments have been directed to satisfy such conditions.

Surface mount device (SMD) process for a substrate mounted on an electronic device may be done at high temperatures, and two substrates may bend during this process. If the two substrates bend to different extents, or if the two substrates bent in different directions, the two substrates and the stack-type substrate (for example, interpose) may detach from each other. Such detachment may be a cause of defect that opens the connection between multiple conductive terminals.

SUMMARY

An electronic device according to an embodiment of the disclosure may include a housing, a first substrate disposed in an inner space of the housing and having one or more first electric elements disposed thereon, a second substrate disposed in the inner space to be parallel with the first substrate and having one or more second electric elements disposed thereon, and a third substrate disposed between the first substrate and the second substrate and configured to electrically connect the first substrate and the second substrate, the second substrate being disposed from the first substrate in a first direction, wherein the second substrate includes a first metal layer including a first metal pattern connected to ground and multiple first slits formed by removing a portion of the first metal pattern, each of the multiple first slits having a cross shape, a second metal layer formed from the first metal layer in a second direction opposite to the first direction and including a second metal pattern connected to the ground and multiple second slits formed by removing a portion of the second metal pattern, each of the multiple second slits having the cross shape, and multiple ground vias extending through at least a portion of the second substrate so as to connect the first metal pattern of the first metal layer to the second metal pattern of the second metal layer.

An electronic device according to an embodiment of the disclosure may include a housing, a first substrate disposed in an inner space of the housing and having one or more first electric elements disposed thereon, a second substrate disposed in the inner space to be parallel with the first substrate and having one or more second electric elements disposed thereon, and a third substrate disposed between the first substrate and the second substrate and configured to electrically connect the first substrate and the second substrate, the second substrate being disposed from the first substrate in a first direction, wherein the second substrate includes a first metal layer including a first metal pattern connected to ground and multiple first slits formed by removing a portion of the first metal pattern, each of the multiple first slits having a first shape, a second metal layer formed from the first metal layer in a second direction opposite to the first direction and including a second metal pattern connected to the ground and multiple second slits formed by removing a portion of the second metal pattern, each of the multiple second slits having a second shape other than the first shape, and multiple ground vias extending through at least a portion of the second substrate so as to connect the first metal pattern of the first metal layer to the second metal pattern of the second metal layer, and wherein, when the second substrate is viewed from the first direction, portions of the first metal layer excluding the multiple first slits are arranged to overlap the second metal pattern of the second metal layer, and portions of the second metal layer excluding the multiple second slits are arranged to overlap the first metal pattern of the first metal layer.

An electronic device according to an embodiment of the disclosure may have a slit formed in a second substrate (for example, sub-substrate or slave substrate), thereby adjusting the remained copper ratio of the second substrate (i.e. a ratio proportional to the amount of copper remaining in the second substrate), and may prevent two substrates (for example, first and second substrates) and a stack-type substrate (for example, interposer) from detaching from each other.

An electronic device according to an embodiment of the disclosure may provide a second substrate having a shielding structure configured such that multiple ground vias can be disposed near the slit.

Various other advantageous effects identified explicitly or implicitly through the disclosure may be provided.

DETAILED DESCRIPTION

Certain embodiments of the disclosure may provide an electronic device configured to prevent two substrates and a stack-type substrate (for example, interposer) from detaching from each other.

Certain embodiments of the disclosure may provide an electronic device including a substrate having a shielding structure configured such that multiple ground vias can be disposed near a slit.

Technical problems to be solved by the disclosure are not limited to the above-mentioned technical problems, and other technical problems not mentioned herein will be clearly understood from the following description by those skilled in the art to which the disclosure pertains.

Figure 1:
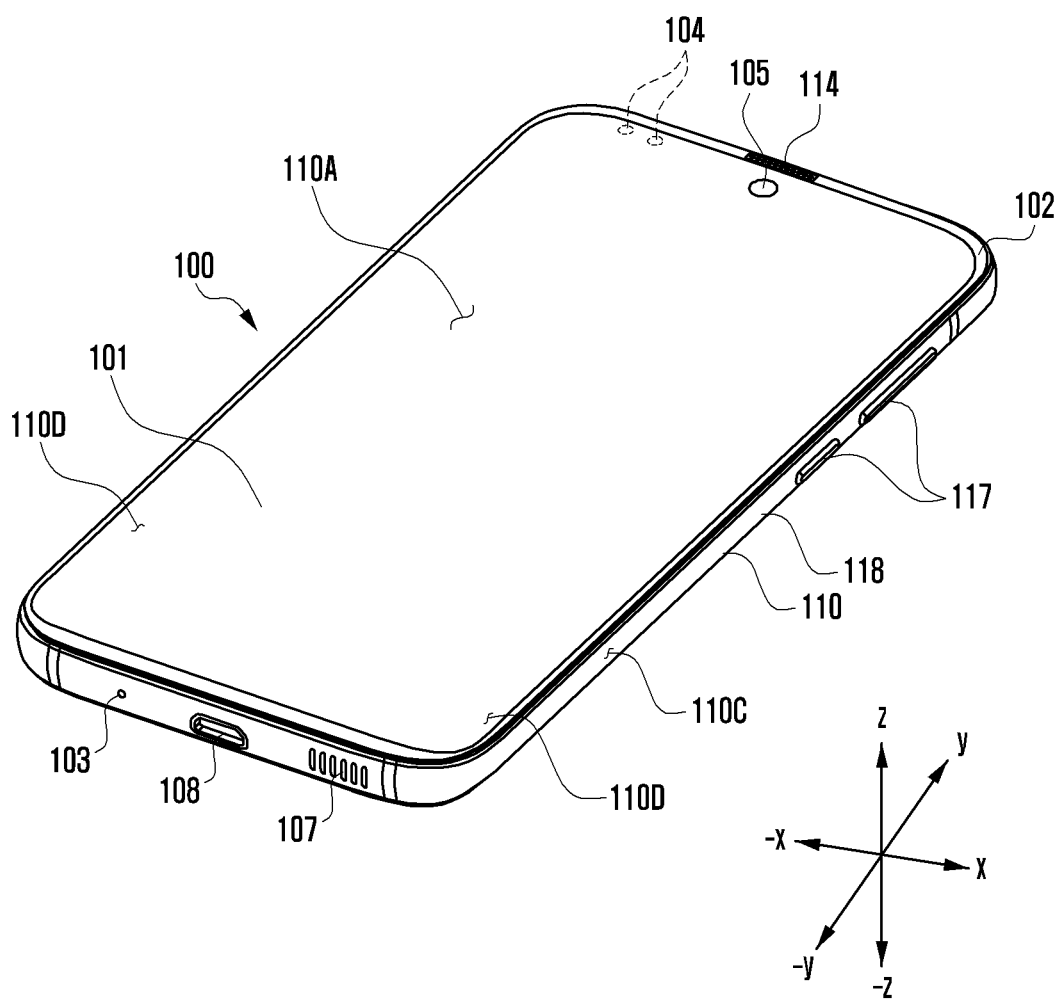
FIG. 1 is a front perspective view of a mobile electronic device according to an embodiment disclosed herein.
Figure 2:
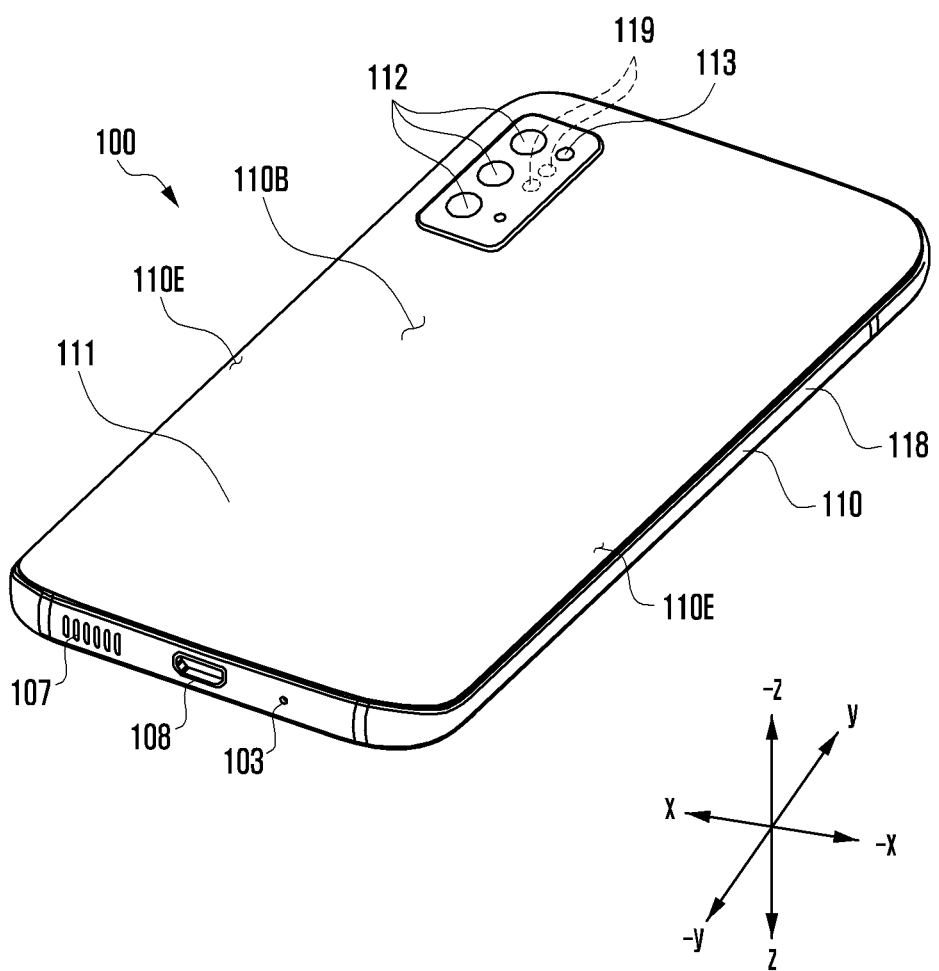
FIG. 2 is a rear perspective view of the electronic device in FIG. 1 according to an embodiment disclosed herein.

FIG. 1 is a front perspective view of a mobile electronic device 100 according to an embodiment disclosed herein. FIG. 2 is a rear perspective view of the electronic device 100 in FIG. 1 according to an embodiment disclosed herein.

Referring to FIG. 1 and FIG. 2, the electronic device 100 according to an embodiment may include a housing 110 including a first surface (or a front surface) 110A, a second surface (or a rear surface) 110B, and a lateral surface 110C surrounding a space between the first surface 110A and the second surface 110B. According to another embodiment (not shown), the housing may refer to a structure for configuring a portion of the first surface 110A, the second surface 110B, and the lateral surface 110C in FIG. 1. According to an embodiment, at least a portion of the first surface 110A may be made of a substantially transparent front plate 102 (for example, a glass plate including various coating layers or a polymer plate). The second surface 110B may be made of a substantially opaque rear plate 111. The rear plate 111 may be formed by, for example, coated or colored glass, ceramic, polymers, metals (for example, aluminum, stainless steel (STS), or magnesium), or a combination of at least two thereof. The lateral surface 110C may be coupled to the front plate 102 and the rear plate 111 and formed by a lateral bezel structure 118 (or a "lateral member") including a metal and/or a polymer. In an embodiment, the rear plate 111 and the lateral bezel structure 118 may be integrally formed and be made of the same material (for example, metal material such as aluminum).

In the embodiment illustrated above, the front plate 102 may include first area 110D seamlessly extending from the first surface 110A to be bent toward the rear plate at the opposite ends of a long edge of the front plate. In the embodiment illustrated above (see FIG. 2), the rear plate 111 may include second area 110E seamlessly extending from the second surface 110B to be bent toward the front plate at the opposite ends of the long edge. In an embodiment, the front plate 102 or the rear plate 111 may include only one of the first areas 110D or the second areas 110E. In an embodiment, the front plate 102 may not include the first area and the second area, but include a flat surface disposed in parallel with the second surface 110B. In the embodiments above, when viewed from the lateral side of the electronic device, the lateral bezel structure 118 may have a first thickness (or a width) at the lateral surface in which the first area 110D or the second area 110E is not included, and may have a second thickness thinner than the first thickness at the lateral surface in which the first area or the second area is included.

According to an embodiment, the electronic device 100 may include at least one of a display 101, an input device 103, an audio output device 107 and 114, a sensor module 104 and 119, a camera module 105, 112, and 113, a key input device 117, an indicator (not shown), and a connector 108 and 109. In an embodiment, the electronic device 100 may omit one of components (for example, the key input device 117 or the indicator) or may additionally include another component.

The display 101 may be exposed through, for example, a substantial portion of the front plate 102. In an embodiment, at least a part of the display 101 may be exposed through the front plate 102 configuring the first surface 110A and the first area 110D of the lateral surface 110C. The display 101 may be combined to or disposed adjacent to a touch sensing circuit, a pressure sensor for measuring a strength (pressure) of a touch, and/or a digitizer for detecting a magnetic field-type stylus pen. In an embodiment, at least a part of the sensor module 104 and 119 and/or at least a part of the key input device 117 may be disposed on the first area 110D and/or the second area 110E.

The input device 103 may include a microphone 103. In an embodiment, the input device 103 may include multiple microphone 103 arranged so as to detect a direction of sound. The audio output device 107 and 114 may include speakers 107 and 114. The speakers 107 and 114 may include an outer speaker 107 and a receiver hole 114 for calling. In an embodiment, the microphone 103, the speakers 107 and 114, and the connectors 108 and 109 may be arranged in the space of the electronic device 100 and exposed to the outside environment through at least one hole formed through the housing 110. In an embodiment, a hole formed in the housing 110 may be used in common for the microphone 103 and the speakers 107 and 114. In an embodiment, the audio output device 107 and 114 may include a speaker (for example, a piezo speaker) operating without a hole formed in the housing 110.

The sensor module 104 and 119 may generate an electrical signal or a data value corresponding to an internal operation state or external environment state of the electronic device 100. The sensor module 104 and 119 may include a first sensor module 104 (for example, a proximity sensor) disposed on the first surface 110A of the housing 110 and/or a second sensor module (not shown) (for example, a fingerprint sensor), and/or a third sensor module 119 (for example, an HRM sensor) disposed on the second surface 110B of the housing 110. The fingerprint sensor may be disposed on the first surface 110A (for example, a home key button 115), on a partial area of the second surface 110B, or under the display 101 of the housing 110. The electronic device 100 may further include at least one sensor module not shown in the drawings, for example, a gesture sensor, a gyro sensor, an air pressure sensor, a magnetic sensor, an acceleration sensor, a grip sensor, a color sensor, an infrared (IR) sensor, a biometric sensor, a temperature sensor, humidity sensor, or an illuminance sensor 104.

The camera module 105, 112, and 113 may include the first camera device 105 disposed on the first surface 110A of the electronic device 100 and the second camera device 112 disposed on the second surface 110B, and/or a flash 113. The camera modules 105 and 112 may include one or more of lenses, an image sensor, and/or an image signal processor. The flash 113 may include, for example, a light-emitting diode or a xenon lamp. In an embodiment, two or more lenses (a wide-angle lens, a super-wide-angle lens, or a telephoto lens) and image sensors may be arranged on one surface of the electronic device 100.

The key input device 117 may be disposed on the lateral surface 110C of the housing 110. In another embodiment, the electronic device 100 may not include a portion or entirety of the key input device 117 described above, and the excluded key input device 117 may be implemented as various forms such as a soft key on the display 101. In another embodiment, the key input device 117 may be implemented by using a pressure sensor included in the display 101.

The indicator may be disposed, for example, on the first surface 110A of the housing 110. The indicator may provide state information of the electronic device 100 in a form of light, for example. In another embodiment, the light-emitting element may provide, for example, a light source associated with an operation of the camera module 105. The indicator may include, for example, a light emitting diode (LED), an infrared LED (IR LED), and a xenon lamp.

The connector hole 108 and 109 may include a first connector hole 108 capable of receiving a connector (for example, a USB connector) for transmitting or receiving power and/or data to or from an external electronic device, and/or a second connector hole (or an earphone jack) 109 capable of receiving a connector for transmitting or receiving an audio signal to or from an external electronic device.

A certain camera module 105 of the camera modules 105 and 112, a certain sensor module 104 of the sensor modules 104 and 119, or the indicator may be disposed to be exposed through the display 101. By way of example, the camera module 105, the sensor module 104, or the indicator may be disposed in the inner space of the electronic device 100 to be in contact with the external environment through a through-hole extending through the front plate 102 of the display 101. For another example, a certain sensor module 104 may be disposed in the inner space of the electronic device to perform functions thereof without visually exposing through the front plate 102. For example, in this case, a through-hole of the display 101, facing the sensor module may be unnecessary.

Figure 3:
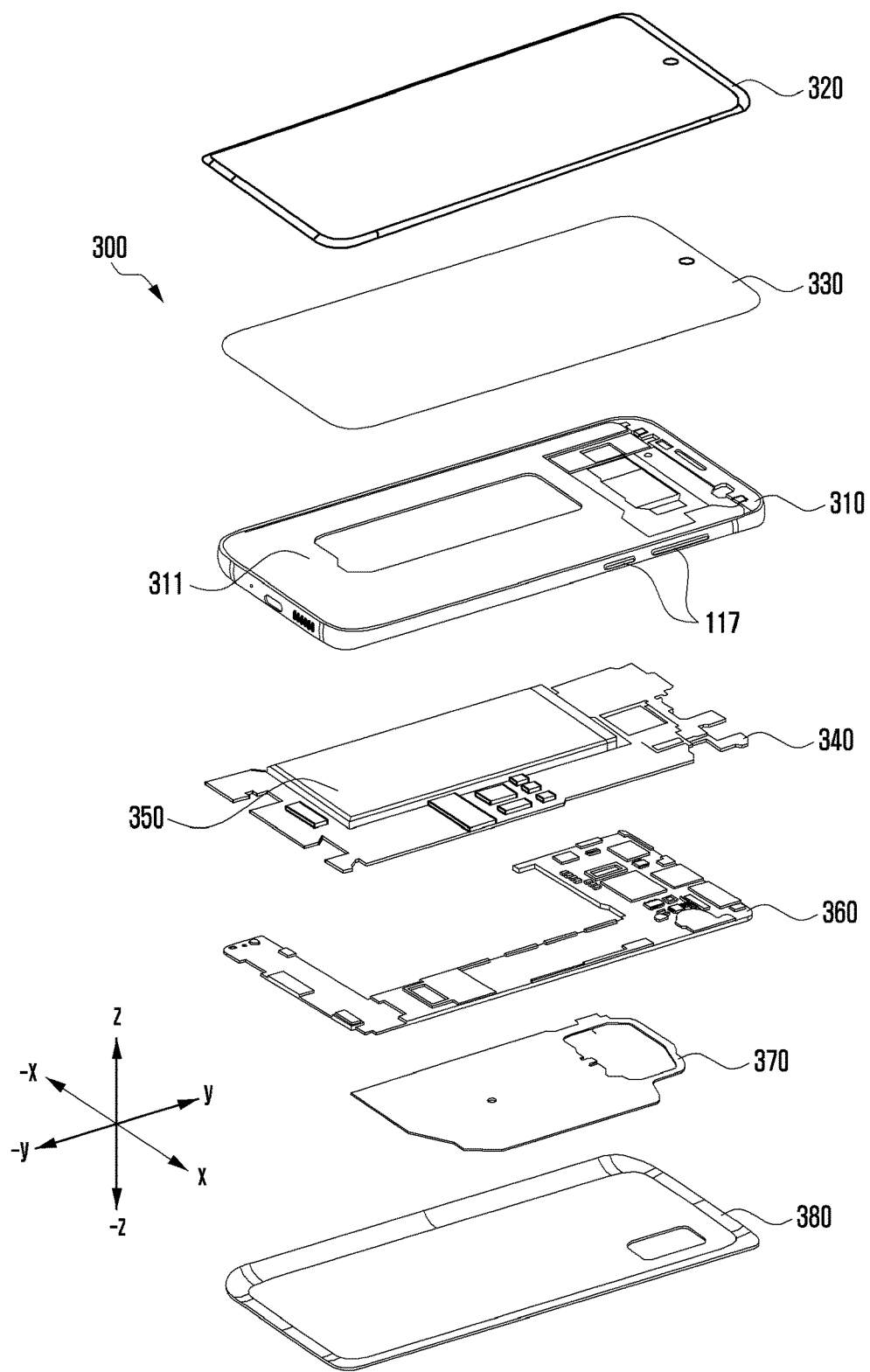
FIG. 3 is an exploded perspective view of the electronic device in FIG. 1 according to an embodiment disclosed herein.

FIG. 3 is an exploded perspective view of the electronic device 100 in FIG. 1 according to an embodiment disclosed herein.

The electronic device 300 In FIG. 3 may be at least partially similar to the electronic device 100 in FIG. 1 and FIG. 2 or may implement another embodiment of an electronic device.

Referring to FIG. 3, the electronic device 300 (for example, the electronic device 100 in FIG. 1 or FIG. 2) may include a lateral member 310 (for example, a lateral bezel structure), a first support member 311 (for example, a bracket or a support structure), a front plate 320 (for example, a front cover), a display 330, a substrate 340, a battery 350, a second support member 360 (for example, a rear case), an antenna 370, and a rear plate 380 (for example, a rear cover). In an embodiment, the electronic device 300 may omit at least one of the components (for example, the first support member 311 or the second support member 360) or additionally include another component. At least one of the components of the electronic device 300 may be the same as or similar to at least one of the components of the electronic device 100 in FIG. 1 or FIG. 2, and thus the overlapping description thereof will be omitted.

The first support member 311 may be disposed in the electronic device 300 to be connected to the lateral structure 310 or integrally formed with the lateral structure 310. The first support member 311 may be made of, for example, metal material and/or non-metal (for example, polymer) material. The first support member 311 may have the display 330 coupled to one surface thereof and the substrate 340 coupled to the other surface thereof. A processor, a memory, and/or an interface may be mounted to the substrate 340. The processor may include, for example, one or more of a central processing device, an application processor, a graphic processing device, an image signal processor, a sensor hub processor, or a communication processor.

The memory may include, for example, a transitory memory or a non-transitory memory.

The interface may include, for example, a high definition multimedia interface (HDMI), a universal serial bus (USB) interface, a SD card interface, and/or an audio interface. The interface, for example, may electrically or physically connect the electronic device 300 to an external electronic device, and may include a USB connector, SD card/MMC connector, or an audio connector.

The battery 350 is a device for supplying power to at least one component of the electronic device 300, and may include, for example, a non-rechargeable primary battery, or a rechargeable secondary battery, or a fuel cell. At least a part of the battery 350 may be disposed, for example, on a substantially identical plane to the substrate 340. The battery 350 may be integrally disposed inside the electronic device 300. In another example, the battery 350 may be disposed to be attachable to/detachable from the electronic device 300.

The antenna 370 may be interposed between the rear plate 380 and the battery 350. The antenna 370 may include, for example, a near field communication (NFC) antenna, a wireless charge antenna, and/or a magnetic secure transmission (MST) antenna. The antenna 370, for example, may perform near field communication with an external device or wirelessly transmit and receive power required for charging. In another embodiment, an antenna structure may be formed by a part or a combination of the lateral bezel structure 310 and/or the first support member 311.

Figure 4:
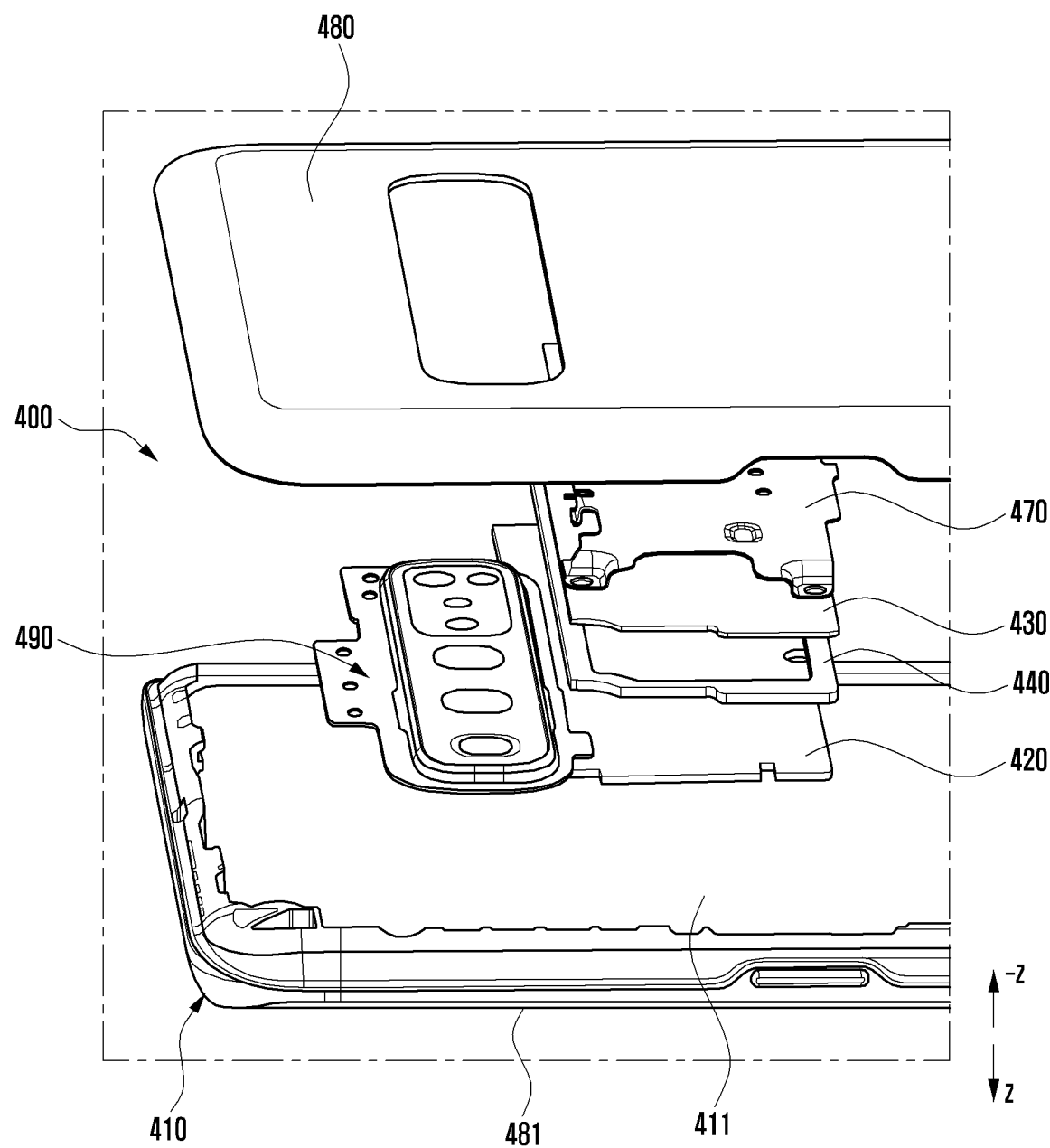
FIG. 4 is an exploded perspective view of an electronic device in which a stackable substrate is applied between two substrates according to an embodiment disclosed herein.

FIG. 4 is an exploded perspective view of an electronic device 400 in which a stackable substrate 440 is applied between two substrates 420 and 430 according to an embodiment disclosed herein.

The electronic device 400 In FIG. 4 may be at least partially similar to the electronic device 100 in FIG. 1 and FIG. 2 or the electronic device 300 in FIG. 3 or may implement other embodiments of an electronic device.

Referring FIG. 4, the electronic device 400 (for example, the electronic device 300 in FIG. 3) may include a housing (for example, the housing 110 in FIG. 1) including a front cover 481 (for example, the front plate 320 in FIG. 3), a rear cover 480 (for example, the rear plate 380 in FIG. 3) facing a direction opposite to the front cover 481, and a lateral frame 410 (for example, the lateral member 310 in FIG. 3) surrounding a space between the front cover 481 and the rear cover 480. According to an embodiment, the electronic device 400 may include a first support member 411 (for example, the first support member 311 in FIG. 3) disposed in an inner space thereof. According to an embodiment, the first support member 411 may be integrated with the lateral frame 410 to extend into the inner space from the lateral frame 410. In another embodiment, the first support member 411 may be separately provided in the inner space of the electronic device 400. According to an embodiment, the first support member 411 may extend from the lateral frame 410 and have at least a partial area made of a conductive material. According to an embodiment, the electronic device 400 may further include a camera structure 490 disposed in a space between the front cover 481 and the rear cover 480.

According to an embodiment, the electronic device 400 may include a pair of substrates 420 and 430 (for example, printed circuit boards (PCBs)) disposed between the first support member 411 and the rear cover 480 in the inner space. According to an embodiment, when viewing the rear cover 480 from above as shown in FIG. 4, the pair of substrates 420 and 430 may disposed such that at least portions thereof overlap with each other. According to an embodiment, the pair of substrates 420 and 430 may include a first substrate 420 (for example, the main substrate) disposed between the first support member 411 and the rear cover 480 and a second substrate 430 (for example, the sub-substrate) disposed between the first substrate 420 and the rear cover 480.

According to an embodiment, the electronic device 400 may include a third substrate 440 (for example, an interposer or a stackable substrate) interposed between the first substrate 420 and the second substrate 430. According to an embodiment, the third substrate 440 may include multiple conductive terminals and come into physical contact with conductive terminals arranged on the two substrates 420 and 430 so as to electrically connect the two substrates 420 and 430. For example, the third substrate 440 may be preferentially mounted on the first substrate 420 using a pre-solder applied on the conductive terminals. In another example, the third substrate 440 may be preferentially mounted on the second substrate 430 using a pre-solder applied on the conductive terminals. According to an embodiment, the electronic device 400 may include a second support member 470 disposed between the second substrate 430 and the rear cover 480. According to an embodiment, the second support member 470 may be disposed at a position at least partially overlapping the second substrate 430. According to an embodiment, the second support member 470 may include a metal plate. Accordingly, the first substrate 420, the third substrate 440, and the second substrate 430 may be fixed to the first support member 411 through the second support member 470 disposed thereon. For example, the second support member 470 may be fastened to the first support member 411 using a fastening member such as a screw so as to firmly support the electric connection among the first substrate 420, the third substrate 440, and the second substrate 430. In another embodiment, the first substrate 420, the third substrate 440, and the second substrate 430 may be disposed in the inner space of the electronic device 400 without the second support member 470.

An electronic device (for example, the electronic device 100 in FIG. 1) according to an embodiment of the disclosure may include a housing (for example, the housing 110 in FIG. 1), a first substrate (for example, the first substrate 420 in FIG. 6) disposed in the inner space of the housing 110 and having one or more first electric elements (for example, the first electric element 611 in FIG. 6) disposed thereon, a second substrate (for example, the second substrate 430 in FIG. 6) disposed in the inner space to be parallel with the first substrate 420 and having one or more second electric elements (for example, the second electric element 612 in FIG. 6) disposed thereon, and a third substrate (for example, the third substrate 440 in FIG. 6) disposed between the first substrate 420 and the second substrate 430 and electrically connecting the first substrate 420 and the second substrate 430. The second substrate 430 may be disposed from the first substrate 420 in a first direction (for example, the first direction (−z direction) in FIG. 6). The second substrate 430 may include a first metal layer (for example, the first metal layer 710 in FIG. 8) which includes a first metal pattern (for example, the first metal pattern 711 in FIG. 8) connected to ground and multiple first slits (for example, the first slit 712 in FIG. 8) formed by removing a portion of the first metal pattern 711, each first slit 712 having a cross shape, a second metal layer (for example, the second metal layer 720 in FIG. 9) which is formed from the first metal layer 710 in a second direction (for example, the second direction (z direction) in FIG. 7) opposite to the first direction (−z direction) and includes a second metal pattern (for example, the second metal pattern 721 in FIG. 9) connected to the ground and multiple second slits (for example, the second slit 722 in FIG. 9) formed by removing a portion of the second metal pattern 721, each second slit 722 having the cross shape, and multiple ground vias (for example, the ground via 731 in FIG. 8) extending through at least a portion of the second substrate 430 so as to connect the first metal pattern 711 of the first metal layer 710 to the second metal pattern 721 of the second metal layer 720.

According to an embodiment, the multiple first slits 712 may be arranged in a matrix form at intervals and the multiple second slits 722 may be arranged in a matrix form at intervals.

According to an embodiment, each of the multiple first slits 712 and each of the multiple second slit 722 may have the same area.

According to an embodiment, each of the multiple first slits 712 may include a first portion disposed at the center of the first slit 712, a second portion disposed from the first portion in +y direction, a third portion disposed from the first portion in −y direction, a fourth portion disposed from the first portion in +x direction, and a fifth portion disposed from the first portion in −x direction, and each of the first portion to the fifth portion may have a square shape of a first width. Each of the second slits 722 may include a sixth portion disposed at the center of the second slit 722, a seventh portion disposed from the sixth portion in +y direction, an eighth portion disposed from the sixth portion in −y direction, a ninth portion disposed from the sixth portion in +x direction, and a tenth portion disposed from the sixth portion in −x direction, and each of the sixth to the tenth portion may have the square shape of the first width.

According to an embodiment, when viewing the second substrate 430 from the first direction (−z direction), the center of one first slit 712 and the center of one second slit 722 may be disposed to be spaced apart by a distance corresponding twice the first width.

According to an embodiment, when viewing the second substrate 430 from the first direction (−z direction), the fourth portion of the first slit 712 and the tenth portion of the second slit 722 may disposed to overlap each other and the fifth portion of the first slit 712 and the ninth portion of the second slit 722 may be disposed to overlap each other.

According to an embodiment, when viewing the second substrate 430 from the first direction (−z direction), the portions of the first slit 712 other than the fourth portion and the fifth portion may be disposed to overlap the second metal pattern 721 of the second metal layer 720, and the portions of the second slit 722 other than the ninth portion and the tenth portion may be disposed to overlap the first metal pattern 711 of the first metal layer 710.

According to an embodiment, the multiple first slits 712 arranged in odd-numbered rows and the multiple first slits 712 arranged in even-numbered rows may not be arranged in a straight line in y direction but be arranged to be shifted from each other.

According to an embodiment, the multiple second slits 722 arranged in odd-numbered rows and the multiple second slits 722 arranged in even-numbered rows may not be arranged in a straight line in y direction but be arranged to be shifted from each other.

According to an embodiment, the multiple ground vias 731 may be arranged at both sides of each first slit 712 at intervals therebetween and connect the first metal pattern 711 to the second metal pattern 721.

An electronic device 100 according to an embodiment of the disclosure may include a housing 110, a first substrate 420 disposed in the inner space of the housing 110 and having one or more first electric elements 611 disposed thereon, a second substrate 430 disposed in the inner space to be parallel with the first substrate 420 and having one or more second electric elements 612 disposed thereon, and a third substrate 440 disposed between the first substrate 420 and the second substrate 430 and electrically connecting the first substrate 420 and the second substrate 430. The second substrate 430 may be disposed from the first substrate 420 in a first direction (−z direction), and the second substrate 430 may include a first metal layer 710 which includes a first metal pattern 711 connected to ground and multiple first slits 712 formed by removing a portion of the first metal pattern 711, each first slit 712 having a first shape, a second metal layer 720 which is formed from the first metal layer 710 in a second direction (z direction) opposite to the first direction (−z direction) and includes a second metal pattern 721 connected to the ground and multiple second slits 722 formed by removing a portion of the second metal pattern 721, each second slit 722 having a second shape different from the first shape, and multiple ground vias 731 extending through at least a portion of the second substrate 430 so as to connect the first metal pattern 711 of the first metal layer 710 to the second metal pattern 721 of the second metal layer 720. When viewing the second substrate 430 from the first direction (−z direction), the portions of the first metal layer 710 excluding the multiple first slits 712 may be disposed to overlap the second metal pattern 721 of the second metal layer 720, and the portions of the second metal layer 720 excluding the multiple second slits 722 may be disposed to overlap the first metal pattern 711 of the first metal layer 710.

According to an embodiment, the first shape may include a cross shape, and the second shape may include a bar shape.

According to an embodiment, two neighboring first slits 712 may have the cross shape and may be connected to each other.

According to an embodiment, the first shape and the second shape may include one shape selected from among a cross shape, a bar shape extending in x direction, a bar shape extending in x direction and having a protrusion protruding from the center of the bar in y direction, a bar shape extending in x direction and having a protrusion protruding from the center of the bar in −y direction, a bar shape extending in x direction and having a protrusion protruding from one end of the bar in y direction, a bar shape extending in x direction and having a protrusion protruding from one end of the bar in −y direction, a bar shape extending in x direction and having a protrusion protruding from another end of the bar in y direction, a bar shape extending in x direction and having a protrusion protruding from another end of the bar in −y direction, a bar shape extending in y direction, a bar shape extending in y direction and having a protrusion protruding from the center of the bar in x direction, a bar shape extending in y direction and having a protrusion protruding from the center of the bar in −x direction, a bar shape extending in y direction and having a protrusion protruding from one end of the bar in x direction, a bar shape extending in y direction and having a protrusion protruding from one end of the bar in −x direction, a bar shape extending in y direction and having a protrusion protruding from another end of the bar in x direction, and a bar shape extending in y direction and having a protrusion protruding from another end of the bar in −x direction.

According to an embodiment, the multiple first slits 712 may be arranged in a matrix form at intervals and the multiple second slits 722 may be arranged in a matrix form at intervals.

According to an embodiment, when viewing the second substrate 430 from the first direction (−z direction), the center of one first slit 712 and the center of one second slit 722 may be disposed to be spaced a pre-configured distance apart from each other.

According to an embodiment, the multiple first slits 712 arranged in odd-numbered rows and the multiple first slits 712 arranged in even-numbered rows may not be arranged in a straight line in y direction but be arranged to be shifted from each other.

According to an embodiment, the multiple second slits 722 arranged in odd-numbered rows and the multiple second slits 722 arranged in even-numbered rows may not be arranged in a straight line in y direction but be arranged to be shifted from each other.

According to an embodiment, the multiple ground vias 731 may be arranged at both sides of each first slit 712 at intervals therebetween and connect the first metal pattern 711 to the second metal pattern 721.

According to an embodiment, the second metal layer 720 may be the outermost layer disposed closest to the first substrate 420 in the stacking structure of the second substrate 430.

Figure 5:
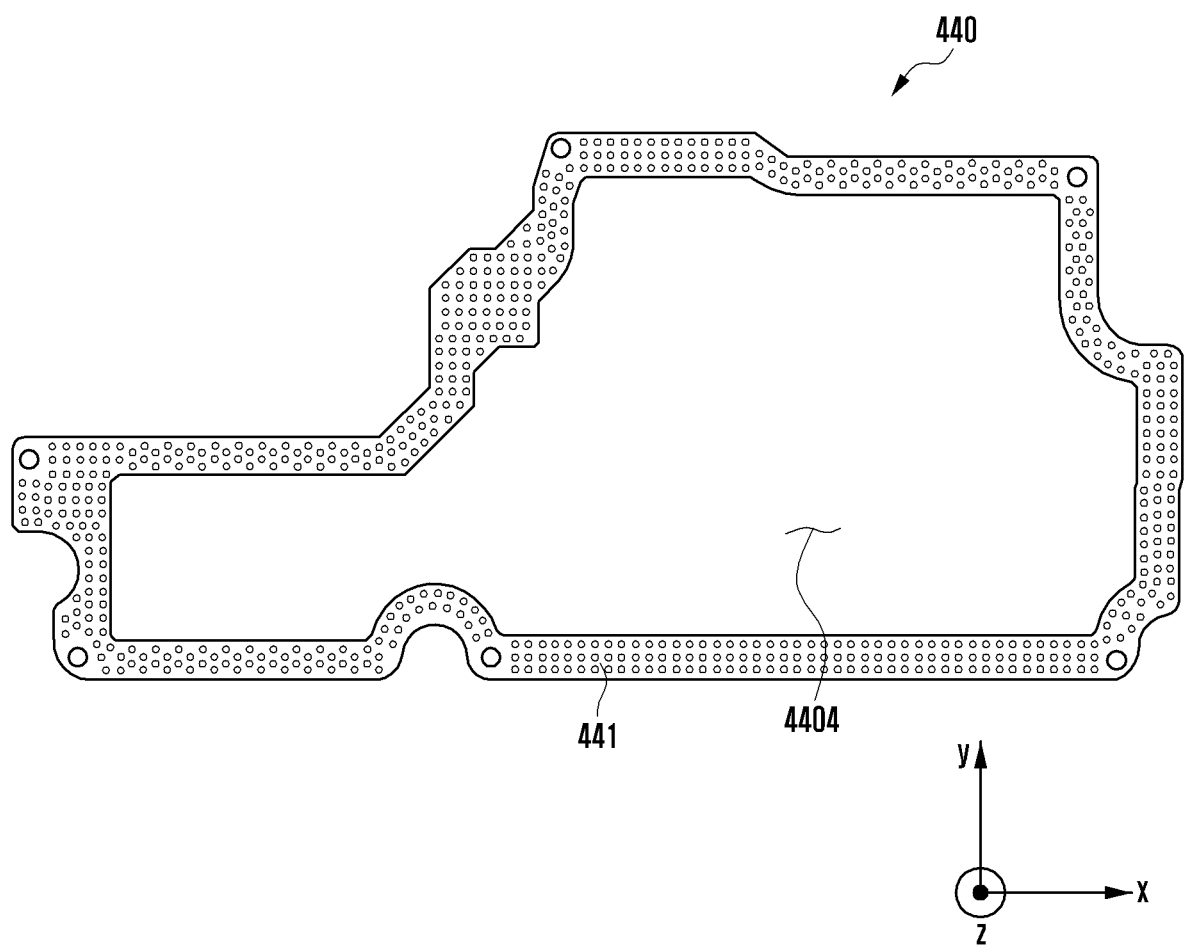
FIG. 5 is a planar view of a third substrate according to an embodiment.
Figure 6:
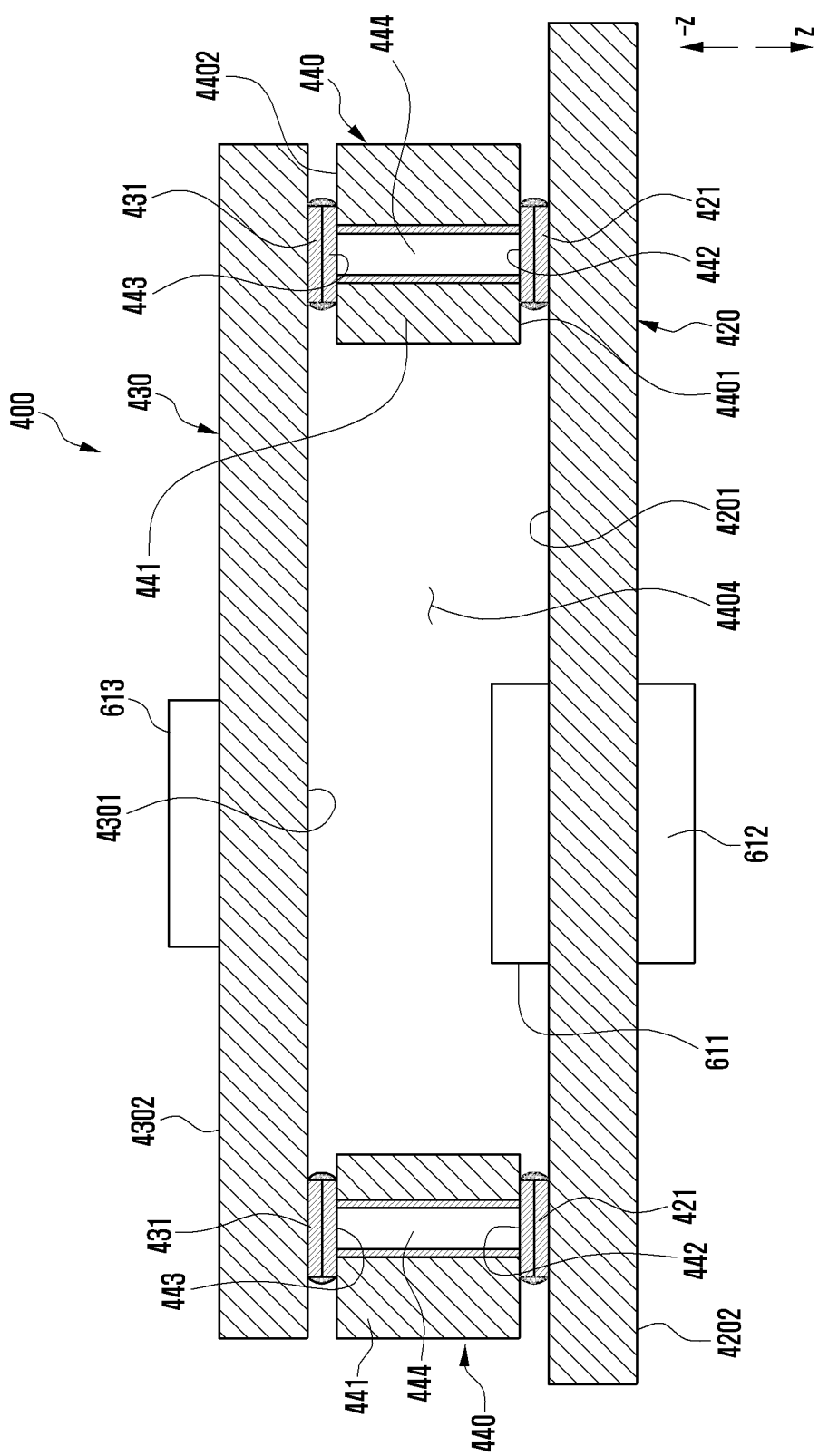
FIG. 6 is a cross-sectional view illustrating a lateral surface of an electronic device in a state in which a pair of substrates is arranged according to an embodiment.

FIG. 5 is a planar view of a third substrate 440 according to an embodiment. FIG. 6 is a cross-sectional view illustrating a lateral surface of an electronic device in a state in which a pair of substrates is arranged according to an embodiment.

Referring to FIG. 5 and FIG. 6, an electronic device 400 (for example, the electronic device 400 in FIG. 4) may include a first substrate 420, a second substrate 430 spaced apart from the first substrate 420 in an overlapping manner, and a third substrate 440 disposed between the first substrate 420 and the second substrate 430. According to an embodiment, the third substrate 440 may include an opening 4404. According to an embodiment, the opening 4404 may be in a closed loop shape or an opened loop shape which is at least partially opened. According to an embodiment, the first substrate 420 may be a main substrate disposed in the inner space of the electronic device (for example, the electronic device 400 in FIG. 4) and may have a larger area than the second substrate 430. According to an embodiment, the third substrate 440 may be formed substantially along an edge of the second substrate 430 and formed to have a designated size so as to surround the opening 4404. In an embodiment, the first substrate 420, the second substrate 430, and/or the third substrate 440 may have the same size or different sizes from each other.

According to an embodiment, the electronic device 400 may include three or more substrates (not shown) unlike the embodiment shown in FIG. 6, and the three or more substrates may be electrically connected to each other by stackable substrates (not shown) which is identical to the third substrate 440 or of which at least a portion is similar to the third substrate. For example, the electronic device may include a multi-stacking structure having three or more substrates.

According to an embodiment, the first substrate 420 may include a first surface 4201 facing the second substrate 430 and a second surface 4202 facing a direction opposite to the first surface 4201. According to an embodiment, the first substrate 420 may include multiple first conductive terminals 421 exposed on the first surface 4201. According to an embodiment, the second substrate 430 may include a third surface 4301 facing the first substrate 420 and a fourth surface 4302 facing a direction opposite to the third surface 4301. According to an embodiment, the second substrate 430 may include multiple second conductive terminals 431 exposed on the third surface 4301. According to an embodiment, the third substrate 440 may include a first substrate surface 4401 facing the first substrate 420 and a second substrate surface 4402 opposite the first substrate surface 4401 and facing the second substrate 430. According to an embodiment, the third substrate 440 may include multiple third conductive terminals 442 disposed on the first substrate surface 4401 to face the multiple first conductive terminals 421 disposed on the first surface 4201 of the first substrate 420. According to an embodiment, the third substrate 440 may include multiple fourth conductive terminals 443 disposed on the second substrate surface 4402 to respectively face the multiple second conductive terminals 431 disposed on the third surface 4301 of the second substrate 430. According to an embodiment, each of the multiple third conductive terminals 442 and the multiple fourth conductive terminals 443 may be electrically connected through a conductive via 444 (for example, a conductive post) disposed to penetrate from the first substrate surface 4401 to the second substrate surface 4402 through a dielectric substrate 441 of the third substrate 440.

According to an embodiment, the first substrate 420 may include at least one first electric element 611 disposed on the first surface 4201 and at least one second electric element 612 disposed on the second surface 4202. According to an embodiment, the second substrate 430 may include a third electric element 613 disposed on the fourth surface 4302. According to an embodiment, the first electric element to the third electric element 611, 612, and 613 may be at least one of an application processor (AP), a communication processor (CP), a power management IC (PMIC), a power supply circuit, an RF-related element (for example, an RF transceiver), or an audio module.

Figure 7:
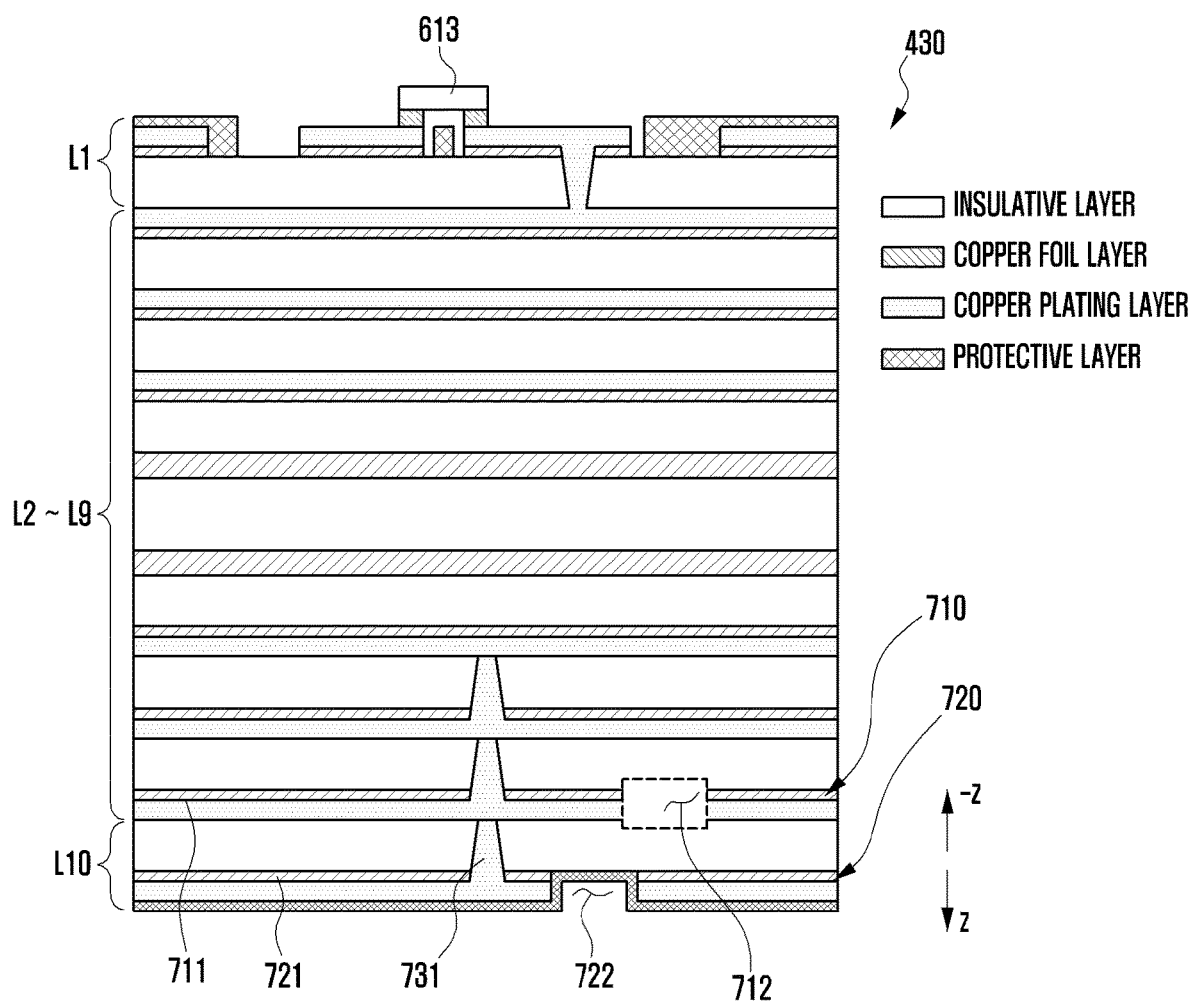
FIG. 7 is a view illustrating a stacking structure of a second substrate according to an embodiment.

According to an embodiment, the second substrate 430 may include a shielding structure (for example, the first metal layer 710 and the second metal layer 720 in FIG. 7) configured to shield electrical noise incurred from the first electric element 611 mounted on the first substrate 420. According to an embodiment, when viewing the second substrate 430 from above (for example, z direction), the area in which the shielding structure is disposed may be located at a position overlapping at least the first electric element 611. According to an embodiment, when viewing the second substrate 430 from above (for example, z direction), the area in which the shielding structure is disposed may be located at not only the position overlapping the first electric element 611 but also a position not overlapping the first electric element 611. For example, the shielding structure may be disposed to correspond to the entire area of the second substrate 430. According to an embodiment, the shielding structure of the second substrate 430 may include a metal layer that includes a metal pattern connected to ground, multiple slits formed by removing at least a portion of the metal pattern from the metal layer, and multiple ground vias arranged around the multiple slits and penetrating at least some layers of the second substrate 430 to connect the metal pattern to the ground. According to an embodiment, when viewing the second substrate 430 from above (for example, z direction), the metal pattern of the second substrate 430 may be disposed at a position overlapping at least the first electric element 611 and electrically connected to a ground structure (for example, a conductive bracket) inside the electronic device to perform the shielding function. For example, electrical noise incurred from the first electric element 611 may be shielded by the metal pattern formed on at least a portion of the second substrate 423 and the multiple ground vias arranged around the multiple slits so as not to be transferred to the third electric element 613 and an inner layer of the second substrate 430 on which the third electric element 613 is disposed.

According to an embodiment, the formation of the multiple slits may adjust a remained copper ratio and a warpage attribute of the second substrate 430. For example, the second substrate 430 may change the warpage attribute by adjusting the remained copper ratio. When the warpage attribute of the second substrate 430 is improved or optimized, it is possible to reduce the possibility of defects, such as an open connection between the first substrate 420 and the third substrate 440 and/or between the second substrate 430 and the third substrate 440. For example, when a surface mount device process of a substrate included in the electronic device is performed at high temperatures, the pair of substrates 420 and 430 may be warped during this process. When the warpage degrees of each of two substrates 420 and 430 are different or the warpage directions of each of two substrates 420 and 430 are different, lifting between the pair of substrates 420 and 430 and the third substrate 440 (for example, an interposer) may occur. The shift may cause the defect of an open connection between the multiple conductive terminals. In certain embodiments disclosed herein, the multiple slits are formed in the second substrate 430 to adjust the remained copper ratio of the second substrate 430 so as to reduce the defect of an open connection between the first substrate 420 and the third substrate 440 and/or between the second substrate 430 and the third substrate 440.

FIG. 7 is a view illustrating a stacking structure of a second substrate 430 according to an embodiment.

Referring to FIG. 7, the stacking structure of the second substrate 430 according to an embodiment may include a middle layer L2-L9, an upper layer L1 disposed in a first direction (−z) from the middle layer L2-L9, and a lower layer L10 disposed in a second direction (z) opposite to the first direction (−z) from the middle layer L2-L9. According to an embodiment, the first direction (−z) may be defined as a direction from the first substrate 420 to the second substrate 430. For example, the first direction (−z) may be −z direction shown in FIG. 6. According to an embodiment, the second direction (z) may be defined as a direction from the second substrate 430 to the first substrate 420. For example, the second direction (z) may be z direction shown in FIG. 6.

According to an embodiment, the middle layer L2-L9 may collectively form an inner layer of the second substrate 430 and may be implemented as a multilayer in which multiple insulative layers, multiple copper foil layers, and multiple copper plating layers are stacked. For example, the middle layer L2-L9 may include a stacking structure in which multiple flexible copper clad laminate (CCL) are stacked. According to an embodiment, the middle layer L2-L9 may include multiple flexible copper clad laminate and at least one layer of the multiple flexible copper clad laminate may be used as the first metal layer 710 connected to ground. For example, the middle layer L2-L9 may include a first metal layer 710 connected to ground. According to an embodiment, the first metal layer 710 may include a first metal pattern 711 connected to ground and multiple first slits 712 formed by removing at least a portion of the first metal pattern 711.

According to an embodiment, the upper layer L1 may be an outer layer disposed in the first direction (−z) of the second substrate 430 and may be a multilayer in which an insulative layer, a copper foil layer, and a copper plating layer are stacked. According to an embodiment, the upper layer L1 may further include a protective layer formed on the outermost layer facing a first direction (−z). According to an embodiment, the protective layer of the upper layer L1 may form a fourth surface (for example, the fourth surface 4302 in FIG. 6) of the second substrate 430 and have a third electric element 613 disposed thereon. According to an embodiment, the protective layer may include a coverlay, a solder resistor, or a photo solder resist (PSR) ink.

According to an embodiment, the lower layer L10 may be an outer layer disposed in the second direction (z) of the second substrate 430 and may be a multilayer in which an insulative layer, a copper foil layer, and a copper plating layer are stacked. According to an embodiment, the lower layer L10 may further include a protective layer formed on the outermost layer facing a first direction (−z). According to an embodiment, the protective layer of the lower layer L10 may form a third surface (for example, the third surface 4301 in FIG. 6) of the second substrate 430 and may be disposed to face the first substrate 420. According to an embodiment, the copper foil layer of the lower layer L10 may be defined as a second metal layer 720 connected to ground. For example, the lower layer L10 may include a second metal layer 720 connected to ground. According to an embodiment, the second metal layer 720 may include a second metal pattern 721 connected to ground and multiple second slits 722 formed by removing at least a portion of the second metal pattern 721.

According to an embodiment, the second substrate 430 may include multiple ground vias 731 configured to electrically connect at least one first metal layer 710 formed on the middle layer L2-L9 to the second metal layer 720 formed on the lower layer L10. According to an embodiment, the multiple ground vias 731 may penetrate at least a portion of the lower layer L10 and at least a portion of the middle layer L2-L9 so as to electrically connect at least one first metal layer 710 to the second metal layer 720. For example, the multiple ground vias 731 may electrically connect the first metal pattern 711 of the first metal layer 710 to the second metal pattern 721 of the second metal layer 720. The multiple ground vias 731 may connect the ground of the first metal layer 710 to the ground of the second metal layer 720 by electrically connecting the first metal pattern 711 to the second metal pattern 721.

Figure 8:
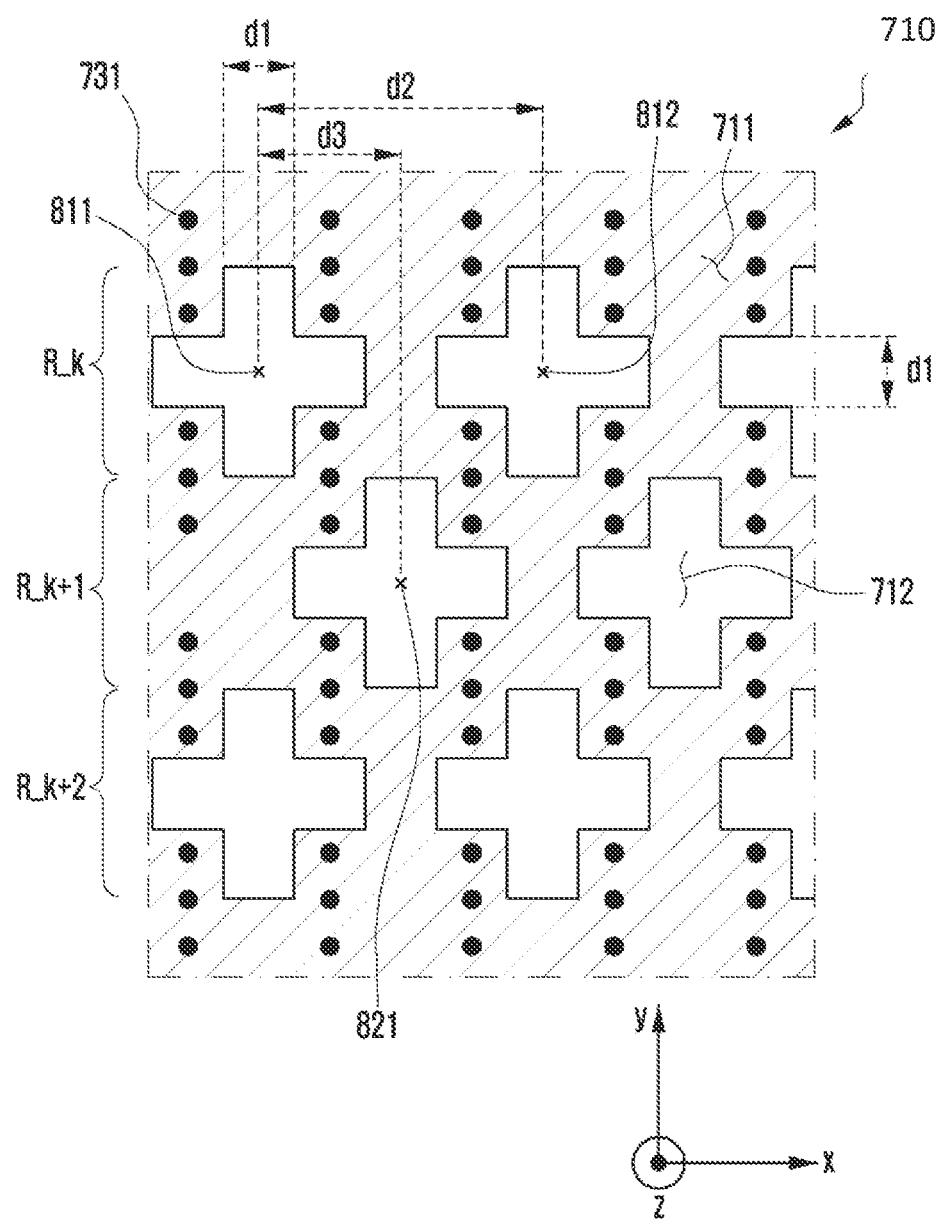
FIG. 8 is a planar view illustrating a first metal layer of a second substrate according to an embodiment.

FIG. 8 is a planar view illustrating a first metal layer 710 of a second substrate 430 according to an embodiment. For example, FIG. 8 may be a planar view illustrating a portion of the first metal layer 710 when viewing the second substrate 430 from above (for example, the first direction (−z)).

Figure 9:
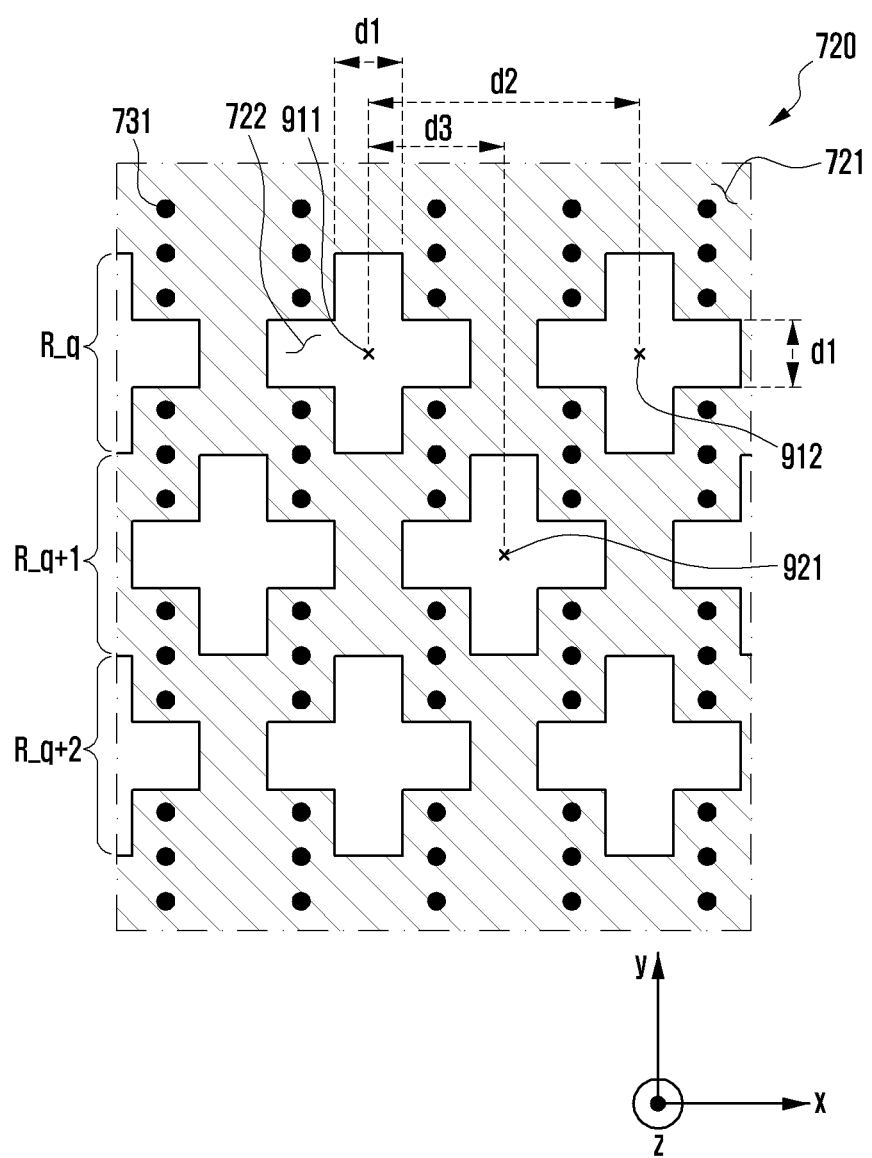
FIG. 9 is a planar view illustrating a second metal layer of a second substrate according to an embodiment.

FIG. 9 is a planar view illustrating a second metal layer 720 of a second substrate 430 according to an embodiment. For example, FIG. 9 may be a planar view of a portion of the second metal layer 720 when viewing the second substrate 430 from above (for example, the first direction (−z)).

The first metal layer 710 shown in FIG. 8 may be at least partially similar to the first metal layer 710 shown in FIG. 7 or may implement another embodiment of the instant disclosure. The second metal layer 720 shown in FIG. 9 may be at least partially similar to the second metal layer 720 shown in FIG. 7 or may implement another embodiment. Hereinafter, in reference to FIG. 8 and FIG. 9 collectively, attributes of the first metal layer 710 and the second metal layer 720 not described in connection with FIG. 7 or are different from those shown in FIG. 7 will be described.

Referring to FIG. 8 and FIG. 9, the first metal layer 710 and the second metal layer 720 may include slits having shapes identical to each other. According to an embodiment, the first metal layer 710 may include multiple first slits 712 having a first shape and the second metal layer 720 may include multiple second slits 722 having a second shape. According to an embodiment, the first shape of the first slit 712 and the second shape of the second slit 722 may be the same.

According to an embodiment, the first slit 712 and the second slit 722 may each have a cross shape. According to an embodiment, the area of each first slit 712 and the area of each second slit 722 may be identical to each other. For example, one side of the first slit 712 may have the first length d1 and the maximum horizontal width (or maximum vertical width) of the first slit 712 may be three times the first length d1. Similarly, one side of the second slit 722 may have the first length d1 and the maximum horizontal width (or maximum vertical width) of the second slit 722 may be three times the first length d1.

According to an embodiment, as shown in FIG. 8, the multiple first slits 712 may be arranged in a matrix form at certain intervals. By way of example, the first slits 712 may be arranged in rows, and the first slits 712 arranged in the k-th row R_k may be arranged at intervals of the first length d1. According to an embodiment, the distance between the centers 811 and 812 of the first slits 712 arranged adjacent to each other in the x direction may have the second length d2. For example, the second length d2 may correspond to four times the first length d1. According to an embodiment, when viewing the second substrate 430 from above (for example, the first direction (−z)), x direction may be a horizontal direction, as shown in FIG. 8.

According to an embodiment, first slits 712 arranged on odd-numbered rows R_k and R_k+2 may not be arranged not to form a straight line with first slits 712 arranged on the even-numbered row R_k+1. For example, the center 811 of the first slits 712 arranged on the odd-numbered rows R_k and R_k+2 and the center 821 of the first slits 712 arranged on the even-numbered row R_k+1 may be arranged not to form a straight line in y direction but are shifted from each other. According to an embodiment, the center 811 of the first slits 712 arranged on the odd-numbered rows R_k and R_k+2 and the center 821 of the first slits 712 arranged on the even-numbered row R_k+1 may be arranged to be spaced apart by a predetermined third length d3 in the x direction. According to an embodiment, when viewing the second substrate 430 from above (for example, the first direction (−z)), y direction may be a vertical direction. For example, the third length d3 may correspond to two times the first length d1.

According to an embodiment, as shown in FIG. 9, the multiple second slits 722 may be arranged in a matrix form at certain intervals. By way of example, the second slits 722 may be arranged in rows, and the second slits 722 arranged in the q-th row R_q may be arranged at intervals of the first length d1. According to an embodiment, the distance between the centers 911 and 912 of the second slits 722 arranged adjacent to each other in the x direction may have the second length d2. For example, the second length d2 may correspond to four times the first length d1. According to an embodiment, when viewing the second substrate 430 from above (for example, the first direction (−z)), x direction may be a horizontal direction.

According to an embodiment, second slits 722 arranged on odd-numbered rows R_q and R_q+2 may not be arranged not to form a straight line with second slits 722 arranged on the even-numbered row R_q+1. For example, the center 911 of the second slits 722 arranged on the odd-numbered rows R_q and R_q+2 and the center 921 of the second slits 722 arranged on the even-numbered row R_q+1 may be arranged not to form a straight line in y direction but are shifted from each other. According to an embodiment, the center 911 of the second slits 722 arranged on the odd-numbered rows R_q and R_q+2 and the center 921 of the second slits 722 arranged on the even-numbered row R_q+1 may be arranged to be spaced apart by a predetermined third length d3 in the x direction. According to an embodiment, when viewing the second substrate 430 from above (for example, the first direction (−z)), y direction may be a vertical direction. For example, the third length d3 may correspond to two times the first length d1.

According to an embodiment, when viewing the second substrate 430 from above (for example, the first direction (−z)), the first slit 712 and the second slit 722 may be disposed to at least partially overlap each other. According to an embodiment, when viewing the second substrate 430 from above (for example, the first direction (−z)), the center 811 of the first slit 712 and the center 911 of the second slit 722 may be disposed to be spaced apart by a predetermined length (for example, the third length d3 in FIG. 10) from each other. Accordingly, the first slit 712 may be divided into a portion overlapping the second slit 722 of the second metal layer 720 and a portion overlapping the second metal pattern 721 of the second metal layer 720. The second slit 722 may be divided into a portion overlapping the first slit 712 of the first metal layer 710 and a portion overlapping the first metal pattern 711 of the first metal layer 710.

According to an embodiment, multiple ground vias 731 may be arranged around the multiple first slits 712. According to an embodiment, the multiple ground vias 731 may be arranged at intervals and may electrically connect the first metal pattern 711 of the first metal layer 710 to the second metal pattern 721 of the second metal layer 720. The multiple ground vias 731 may connect the ground of the first metal layer 710 to the ground of the second metal layer 720 by electrically connecting the first metal pattern 711 to the second metal pattern 721. According to an embodiment, the multiple ground vias 731 may be arranged at both sides of the first slit 712 at intervals therebetween and connect the first metal pattern 711 to the second metal pattern 721.

Figure 10:
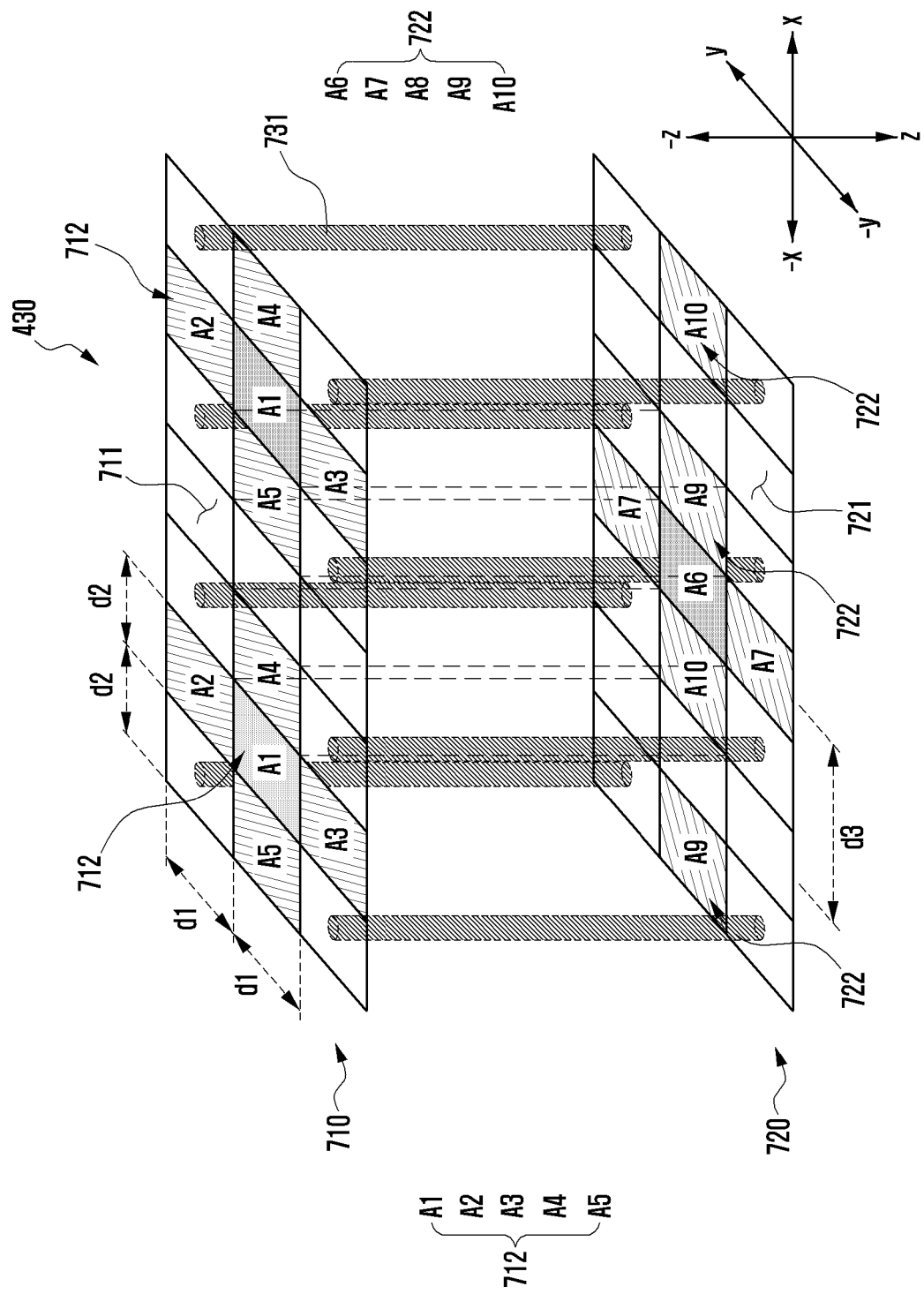
FIG. 10 is a perspective view illustrating an arrangement state of a first metal layer and a second metal layer according to an embodiment.
Figure 11:
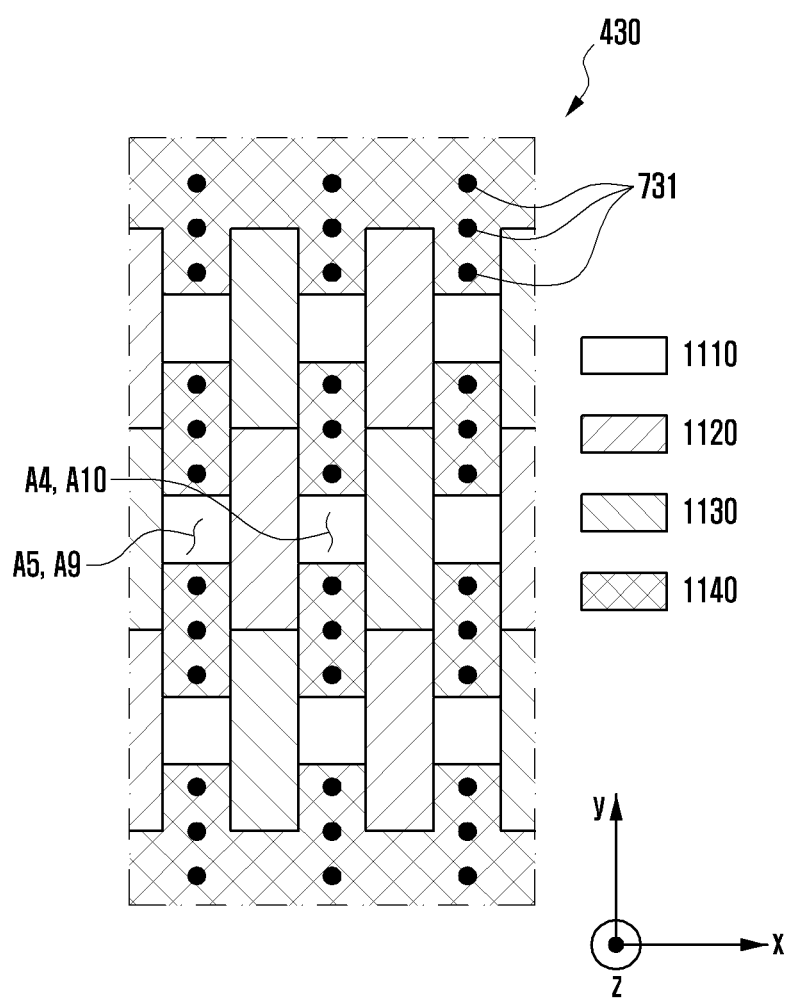
FIG. 11 is a planar view illustrating an arrangement state of a first metal layer and a second metal layer according to an embodiment.

FIG. 10 is a perspective view illustrating an arrangement state of a first metal layer 710 and a second metal layer 720 according to an embodiment disclosed herein. For example, FIG. 10 may be a perspective view of a state in which a portion of the first metal layer 710 and a portion of the second metal layer 720 are disposed to overlap each other. FIG. 11 is a planar view illustrating an arrangement state of a first metal layer 710 and a second metal layer 720 according to an embodiment. For example, FIG. 11 may be a planar view of a state in which a portion of the first metal layer 710 and a portion of the second metal layer 720 are disposed to overlap each other.

Referring to FIG. 10 and FIG. 11, each of the first slits 712 may have a cross shape made up of square-shaped portions. Each of the second slits 722 may have a cross shape made up of square-shaped portions.

According to an embodiment, the first slit 712 may include a first portion A1 disposed at the center of the first slit 712, a second portion A2 disposed from the first portion A1 in +y direction, a third portion A3 disposed from the first portion A1 in −y direction, a fourth portion A4 disposed from the first portion A1 in +x direction, and a fifth portion A5 disposed from the first portion A1 in −x direction. According to an embodiment, each of the first portion A1 to the fifth portion A5 may have a square shape having a first width (for example, the first length d1 in FIG. 8).

According to an embodiment, the second slit 722 may include a sixth portion A6 disposed at the center of the second slit 722, a seventh portion A7 disposed from the sixth portion A6 in +y direction, an eighth portion A8 disposed from the sixth portion A6 in −y direction, a ninth portion A9 disposed from the sixth portion A6 in +x direction, and a tenth portion A10 disposed from the sixth portion A6 in −x direction. Each of the sixth portion A6 to the tenth portion A10 may have a square shape having a first width (for example, the first length d1 in FIG. 9).

According to an embodiment, when viewing the second substrate 430 from above (for example, the first direction (−z)), the first slit 712 and the second slit 722 may be disposed to at least partially overlap each other. According to an embodiment, when viewing the second substrate 430 from above (for example, the first direction (−z)), the center of the first slit 712 and the center of the second slit 722 may be disposed to be spaced apart by a predetermined length, for example, the third length d3 corresponding to two times the first length (or first width) d1. Accordingly, the first slit 712 may be divided into a portion overlapping the second slit 722 of the second metal layer 720 and a portion overlapping the second metal pattern 721 of the second metal layer 720. The second slit 722 may be divided into a portion overlapping the first slit 712 of the first metal layer 710 and a portion overlapping the first metal pattern 711 of the first metal layer 710.

According to an embodiment, when viewing the second substrate 430 from above (for example, the first direction (−z)), the distance between the center of the first slit 712 and the center of the second slit 722 may depend on the number of vias 731 arranged between the first slit 712 and the second slit 722. For example, when viewing the second substrate 430 from above (for example, the first direction (−z)), a predetermined number of vias 731 may be arranged between the first slit 712 and the second slit 722, the distance between the center of the first slit 712 and the center of the second slit 722 may be determined based on the predetermined number or a length corresponding to the predetermined number. For example, as described above, when viewing the second substrate 430 from above (for example, the first direction (−z)), the distance between the center of the first slit 712 and the center of the second slit 722 may be determined based on the distance within which about three vias are arranged at given intervals.

According to an embodiment, as shown in FIG. 11, when viewing the second substrate 430 from the first direction (−z), the fourth portion A4 of the first slit 712 and the tenth portion A10 of the second slit 722 may disposed to overlap each other and the fifth portion A5 of the first slit 712 and the ninth portion A9 of the second slit 722 may be disposed to overlap each other.

According to an embodiment, when viewing the second substrate 430 from above (for example, the first direction (−z)), an area having a hatching pattern 1110 in FIG. 11 may be generated by the first slit 712 and the second slit 722 overlapping each other and may be an area corresponding to the fourth portion A4 and the fifth portion A5 of the first slit 712 and the ninth portion A9 and the tenth portion A10 of the second slit 722.

According to an embodiment, when viewing the second substrate 430 from above (for example, the first direction (−z)), an area having a hatching pattern 1120 in FIG. 11 may be generated by the first slit 712 and the second metal pattern 721 of the second metal layer 720 overlapping each other, and may be an area corresponding to a remaining area of the first slit 712 excluding the fourth portion A4 and the fifth portion A5.

According to an embodiment, when viewing the second substrate 430 from above (for example, the first direction (−z)), an area having a hatching pattern 1130 in FIG. 11 may be generated by the first metal pattern 711 of the first metal layer 710 and the second slit 722 overlapping each other, and may be an area corresponding to a remaining area of the second slit 722 excluding the ninth portion A9 and the tenth portion A10.

According to an embodiment, when viewing the second substrate 430 from above (for example, the first direction (−z)), an area having a hatching pattern 1140 in FIG. 11 may be generated by the first metal pattern 711 of the first metal layer 710 and the second metal pattern 721 of the second metal layer 720 overlapping each other, and the multiple ground vias 731 may be arranged at intervals on the corresponding area.

Figure 12:
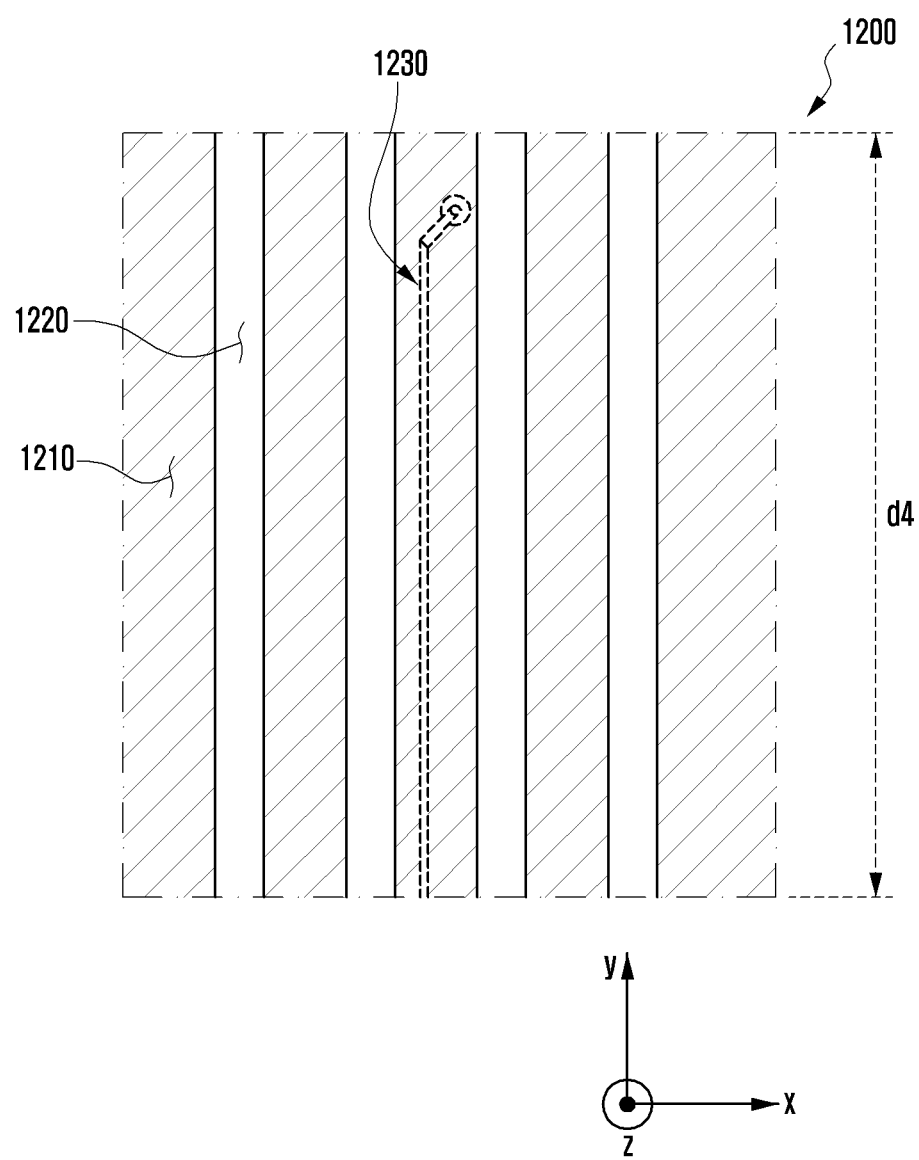
FIG. 12 is a planar view illustrating a portion of a conventional second metal layer.
Figure 13:
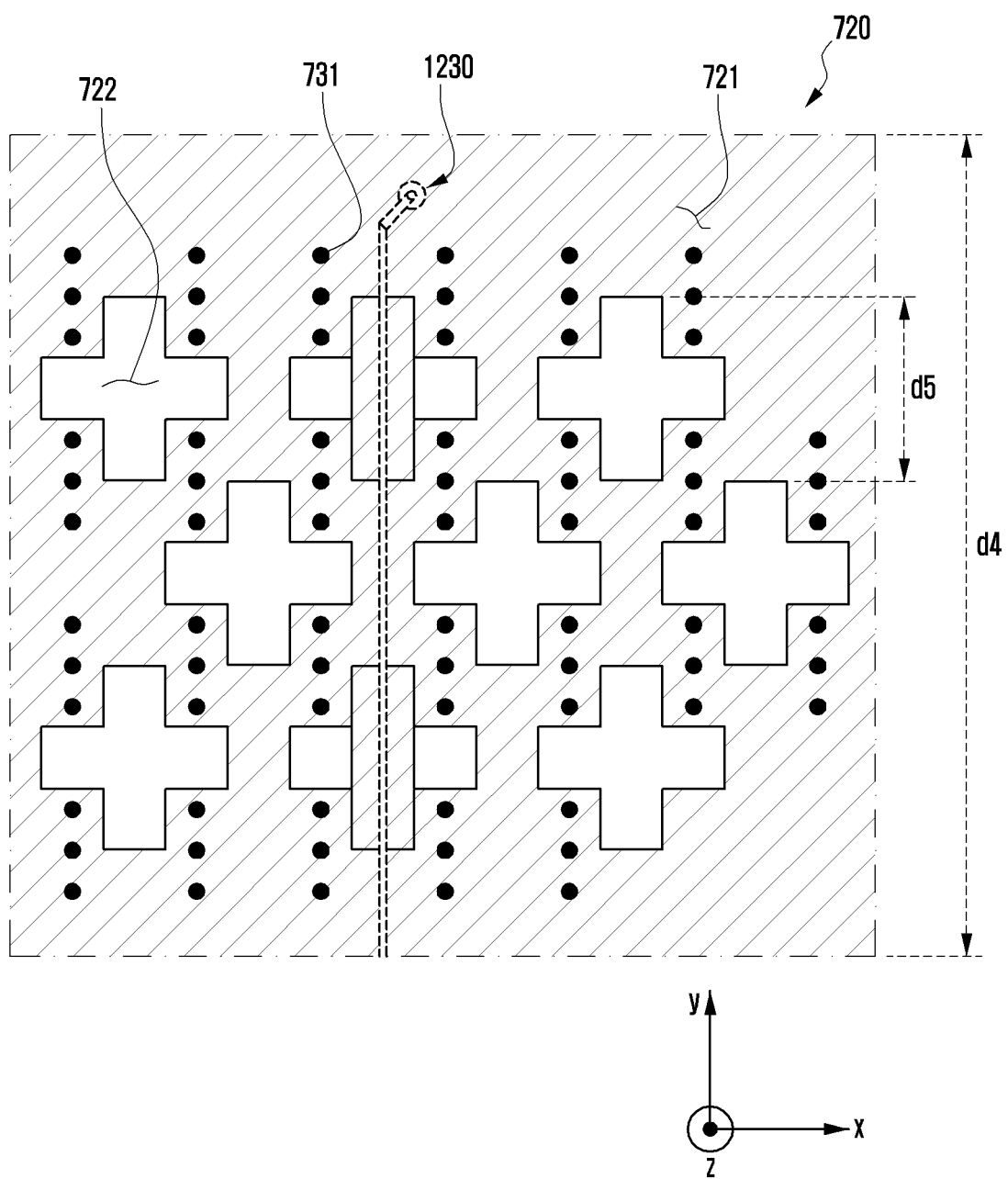
FIG. 13 is a planar view illustrating a portion of a second metal layer according to an embodiment.

FIG. 12 is a planar view illustrating a portion of a conventional second metal layer. FIG. 13 is a planar view illustrating a portion of a second metal layer 720 according to an embodiment.

The second metal layer 720 shown in FIG. 13 may be at least partially similar to the second metal layer 720 shown in FIG. 7 and FIG. 9 or may implement another embodiment. Hereinafter, with reference to FIG. 13, attributes of the second metal layer 720 not described in connection with FIG. 7 or are different from those in FIG. 7 and FIG. 9 will be described. Referring to FIG. 12, the conventional second metal layer 1200 may include a second metal pattern 1210 connected to ground and multiple second slits 1220 formed by removing at least a portion of the second metal pattern 1210. In this conventional example, the second slit 1220 may have a shape extending in y direction. In this conventional example, the multiple second slits 1220 may be arranged in the x direction at intervals. In the conventional second substrate, an RF signal wire 1230 may be formed through the middle layer L2-L9 overlapping the second metal layer 1200.

In the conventional second substrate, the second metal pattern 1210 of the second metal layer 1200 may vertically extend to intersect with the RF signal wire 1230 and a magnetic field affecting the RF signal wire 1230 may be formed by a predetermined current flowing through the second metal pattern 1210. Thus conventionally, when a high frequency signal (or a signal of high current) is provided through the RF signal wire 1230, the magnetic field formed by the second metal pattern 1210 may cause signal distortion and/or crosstalk due to coupling.

Referring to FIG. 13, in the electronic device according to an embodiment, the second slit 722 of the second metal layer 720 is formed to have a cross shape (or a grid shape) and the multiple ground vias 731 are arranged at intervals around the second slit 722, thus reducing the influence of the second metal pattern 721 of the second metal layer 720 over the RF signal wire 1230. For example, when viewing the second substrate 430 from above (for example, the first direction (−z)), the second substrate 430 may reduce signal distortion and/or crosstalk due to coupling by arranging the multiple ground vias 731 around the RF signal wire 1230. For example, in the electronic device according to an embodiment, the length of the slit is shorter than that of the conventional example in FIG. 12 and thus the wavelength of signals passable through the slit may be shortened. For example, the conventional slit 1220 shown in FIG. 12 may have a fourth length d4 and the slit according to an embodiment shown in FIG. 13 may have a fifth length d5 shorter than the fourth length d4.

When the wavelength of the signals passable through the slit is shortened, noise incurred from the middle layer L2-L9 to be radiated outside is reduced, and as a result, a robust shielding structure may be provided.

Figure 14:
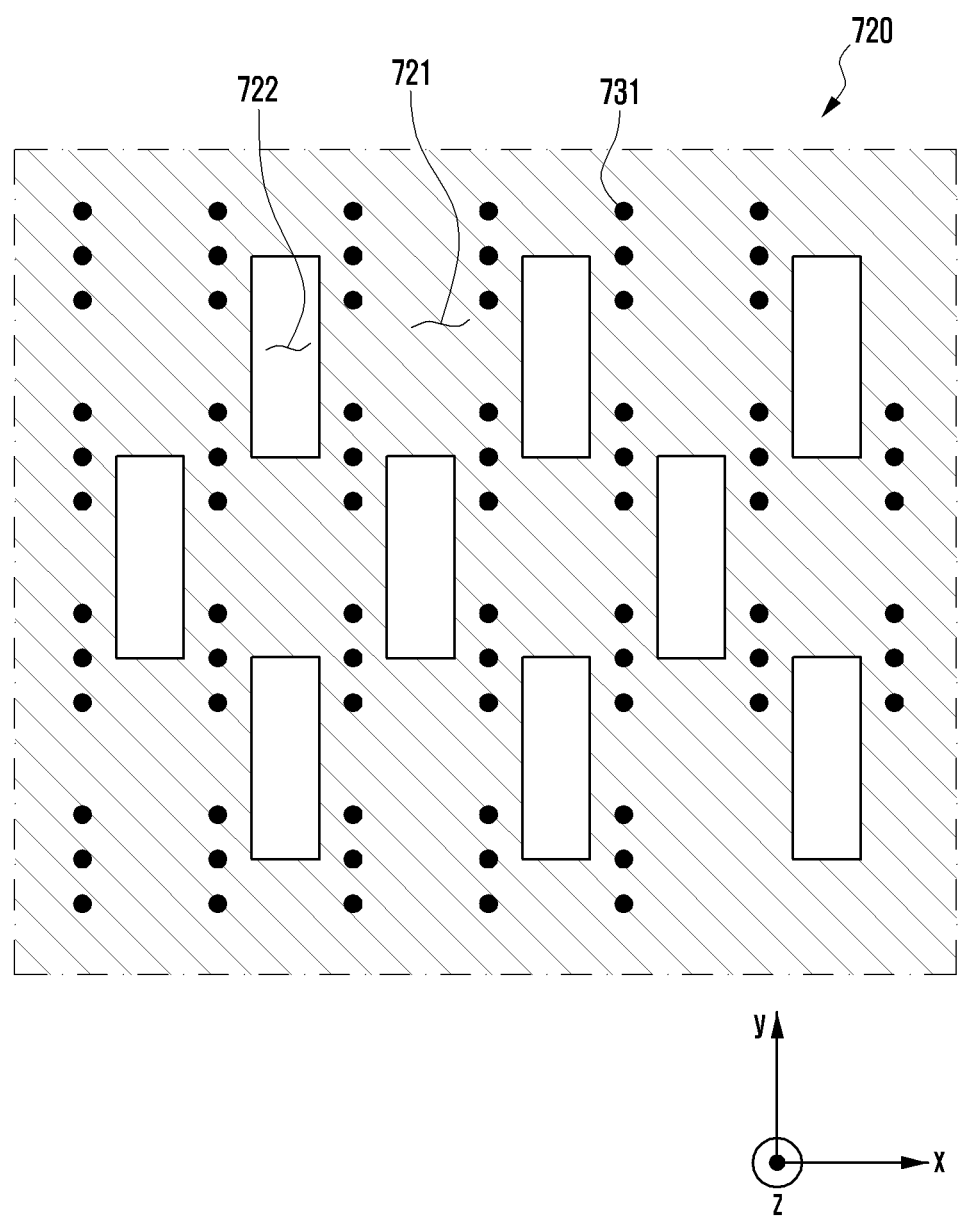
FIG. 14 is a planar view illustrating a second metal layer of a second substrate according to another embodiment.

FIG. 14 is a planar view illustrating a second metal layer 720 of a second substrate 430 according to another embodiment. For example, FIG. 14 may be a planar view of a portion of the second metal layer 720 when viewing the second substrate 430 from above (for example, the first direction (−z)).

Figure 15:
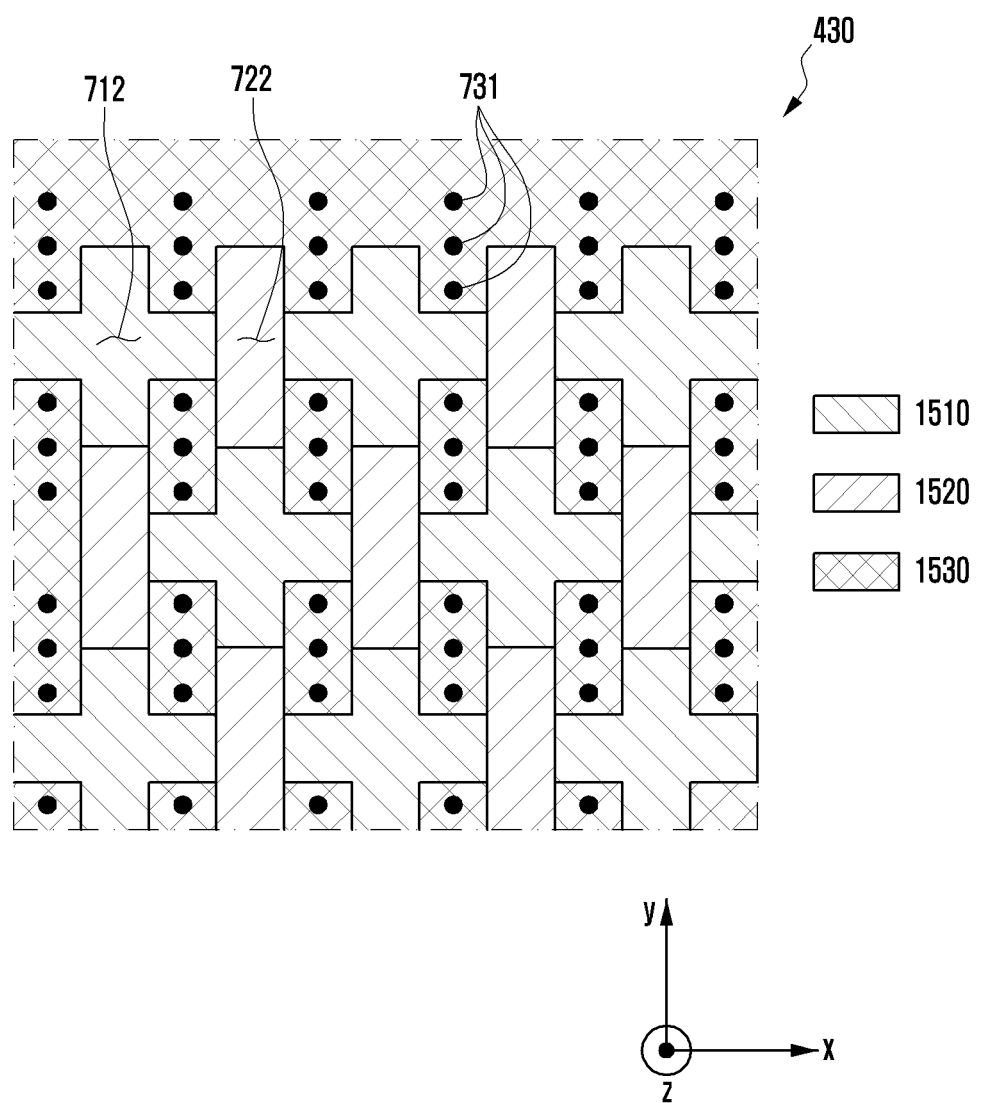
FIG. 15 is a planar view illustrating an arrangement state of a first metal layer and a second metal layer according to another embodiment.

FIG. 15 is a planar view illustrating an arrangement state of a first metal layer 710 and a second metal layer 720 according to another embodiment. For example, FIG. 15 may be a planar view of a state in which a portion of the first metal layer 710 shown in FIG. 8 and a portion of the second metal layer 720 shown in FIG. 14 are disposed to overlap each other. The second metal layer 720 shown in FIG. 14 and FIG. 15 may be at least partially similar to the second metal layer 720 shown in FIG. 7 and FIG. 9 or may include another embodiment. Hereinafter, in reference to FIG. 14 and FIG. 15 collectively, attributes of the second metal layer 720 not described in connection with FIG. 7 and FIG. 9 or are different from those shown in FIG. 7 and FIG. 9 will be described.

Referring to FIG. 14, the second substrate 430 according to another embodiment may include multiple first slits 712 formed on the first metal layer 710 and multiple second slits 722 formed on the second metal layer 720, wherein the shape of the first slit 712 and the shape of the second slit 722 may be different from each other.

According to another embodiment, the first metal layer 710 and the second metal layer 720 may include slits having shapes different from each other. According to another embodiment, the first metal layer 710 may include multiple first slits 712 having a first shape and the second metal layer 720 may include multiple second slits 722 having a second shape. According to another embodiment, the first shape of the first slit 712 and the second shape of the second slit 722 may be different from each other.

According to another embodiment, the multiple first slits 712 formed on the first metal layer 710 may have a cross shape as that shown in FIG. 8.

According to another embodiment, the second multiple slits 722 formed on the second metal layer 720 may have a bar shape as that shown in FIG. 14. For example, the multiple second slits 722 may have a bar shape (for example, a quadrangular shape) extending in the y direction and arranged in a matrix form.

According to another embodiment, as shown in FIG. 14, the second slits 722 arranged on odd-numbered rows may not be arranged not to form a straight line with second slits 722 arranged on even-numbered rows. For example, the center of the second slits 722 arranged on the odd-numbered rows and the center of the second slits 722 arranged on the even-numbered rows may be arranged not to form a straight line in the y direction but to be shifted from each other.

According to another embodiment, as shown in FIG. 15, when viewing the second substrate 430 from above (for example, the first direction (−z)), the first slit 712 may be arranged to completely not overlap the second slit 722. Accordingly, the first slit 712 may not overlap the second slit 722 of the second metal layer 720 but overlap the second metal pattern 721 of the second metal layer 720. The second slit 722 may not overlap the first slit 712 of the first metal layer 710 but overlap the first metal pattern 711 of the first metal layer 710.

According to another embodiment, when viewing the second substrate 430 from above (for example, the first direction (−z)), an area having a hatching pattern 1510[1] in FIG. 15 may be generated by the first slit 712 and the second metal pattern 721 of the second metal layer 720 overlapping each other.

According to another embodiment, when viewing the second substrate 430 from above (for example, the first direction (−z)), an area having a hatching pattern 1520 in FIG. 15 may be generated by the first metal pattern 711 of the first metal layer 710 and the second slit 722 overlapping each other.

According to another embodiment, when viewing the second substrate 430 from above (for example, the first direction (−z)), an area having a hatching pattern 1530 in FIG. 15 may be generated by the first metal pattern 711 of the first metal layer 710 and the second metal pattern 721 of the second metal layer 720 overlapping each other, and the multiple ground vias 731 may be arranged at intervals on the corresponding area.

Referring to FIG. 15, when viewing the second substrate 430 from above (for example, the first direction (−z)), in the second substrate 430 according to another embodiment, the first slit 712 and the second metal pattern 721 are arranged to completely overlap each other, and the second slit 722 and the first metal pattern 711 are arranged to completely overlap each other, thus providing a robust shielding structure.

According to certain embodiments, unlike shown in FIG. 14 and FIG. 15, the shape of the first metal layer 710 and the shape of the second metal layer 720 may be interchanged. For example, FIG. 14 may show the first metal layer 710 according to another embodiments, which may be disposed to overlap the second metal layer 720 shown in FIG. 9.

FIG. 16A to FIG. 16J are planar views illustrating a first metal layer 710 or a second metal layer 720 of a second substrate 430 according to still other embodiments. For example, FIG. 16A to FIG. 16J may be planar views of a portion of the first metal layer 710 or the second metal layer 720 when viewing the second substrate 430 from above (for example, the first direction (−z)).

The second metal layer 720 shown in FIG. 16A to FIG. 16J may be at least partially similar to the first metal layer 710 and/or the second metal layer 720 shown in FIG. 7 and FIG. 9 or may include another embodiment. Hereinafter, in reference to FIG. 16A to FIG. 16J, attributes of the second metal layer 720 not described in connection to FIG. 7 and FIG. 9 or are different from those shown in FIG. 7 and FIG. 9 will be described.

Figure 16A:
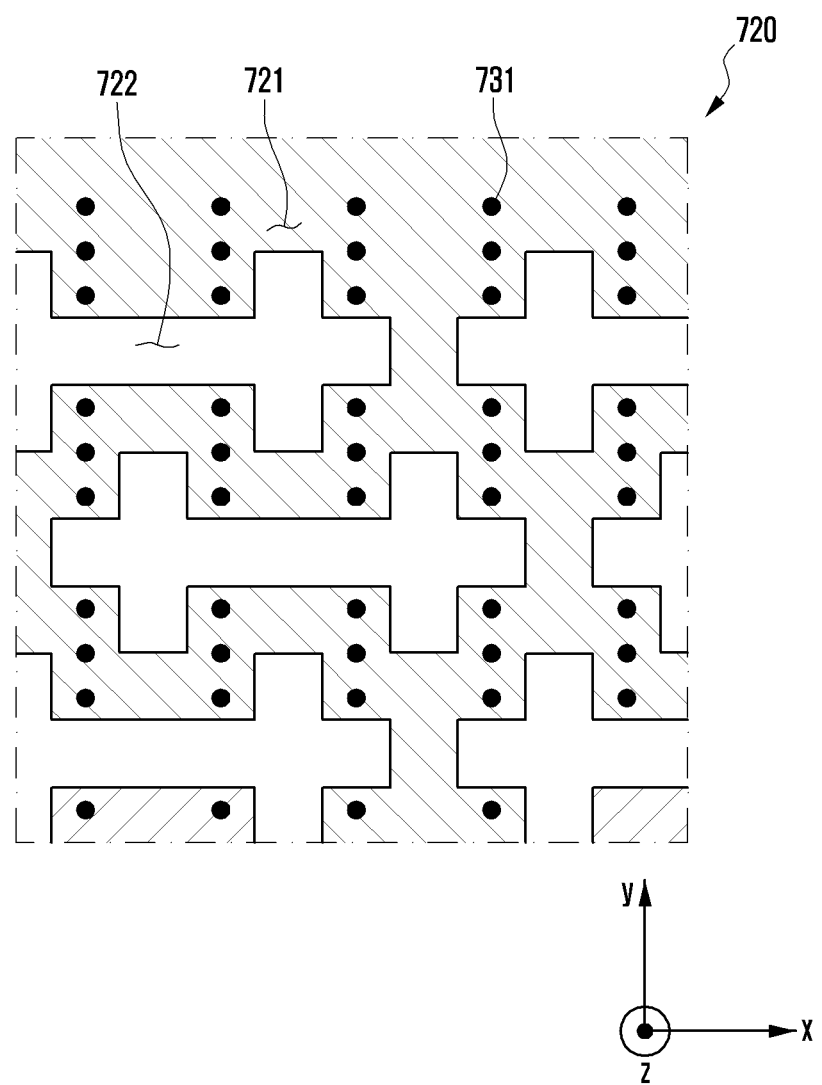
FIG. 16A is a planar view illustrating another embodiment in which two neighboring second slits are connected to each other.

Referring to FIG. 16A, the second metal layer 720 according to another embodiment may include the second metal pattern 721 connected to ground and multiple second slits 722, and the second metal pattern 721 may be electrically connected to a first metal pattern 711 of the first metal layer 710 through multiple ground vias 731. According to another embodiment, the multiple second slits 722 are arranged to have a cross shape and two neighboring second slits 722 may be formed to be connected to each other. For example, two second slits 722 neighboring in the x direction may be connected to each other. For example, a ninth portion A9 (for example, the ninth portion A9 in FIG. 10) of the second slit 722 may be formed to be continuously connected to a tenth portion A10 (for example, the tenth portion A10 in FIG. 10) of the second slit 722, adjacent thereto in the x direction. According to certain embodiments, the first metal layer 710 may be formed in a shape identical or similar to a shape of the second metal layer 720 shown in FIG. 16A. For example, a fourth portion A4 (for example, the fourth portion A4 in FIG. 10) of the first slit 712 may be formed to be continuously connected to a fifth portion A5 (for example, the fifth portion A5 in FIG. 10) of the first slit 712, adjacent thereto in the x direction. In the second substrate 430 according to another embodiment shown in FIG. 16A, two neighboring first slits 712 (or two neighboring second slits 722) are formed to be connected to each other so that the remained copper ratio and the warpage attribute are easily adjusted and the defect of open connection between the first substrate 420 and the third substrate 440 and/or between the second substrate 430 and the third substrate 440 may be reduced.

Figure 16B:
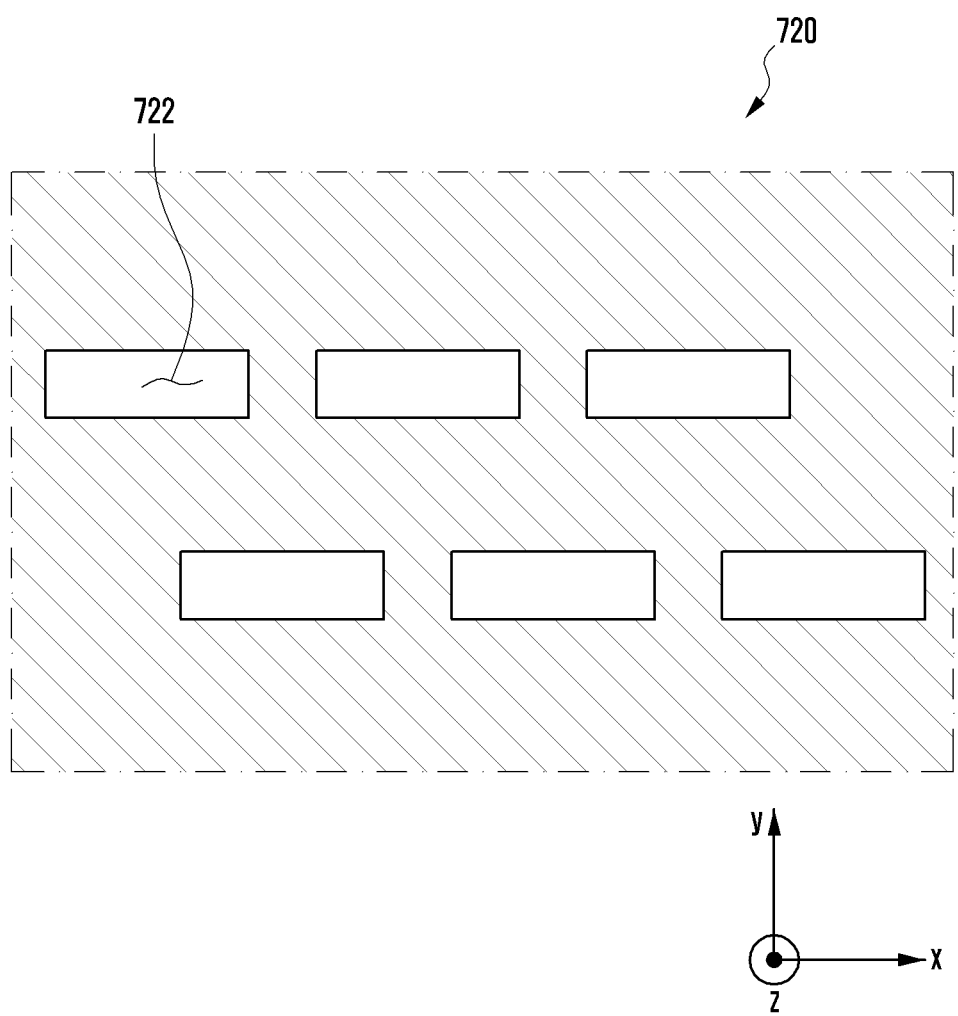
FIG. 16B is a planar view illustrating a second slit having a bar shape (for example, a quadrangular shape) extending in x direction according to another embodiment.

Referring to FIG. 16B, the multiple second slits 722 may be disposed to have a bar shape (for example, a quadrangular shape) extending in the x direction. According to an embodiment, the first metal layer 710 may be formed in a shape identical or similar to the shape of the second metal layer 720 shown in FIG. 16B. For example, although not shown, each of the multiple first slits 712 may be disposed to have a bar shape extending in the x direction.

Figure 16C:
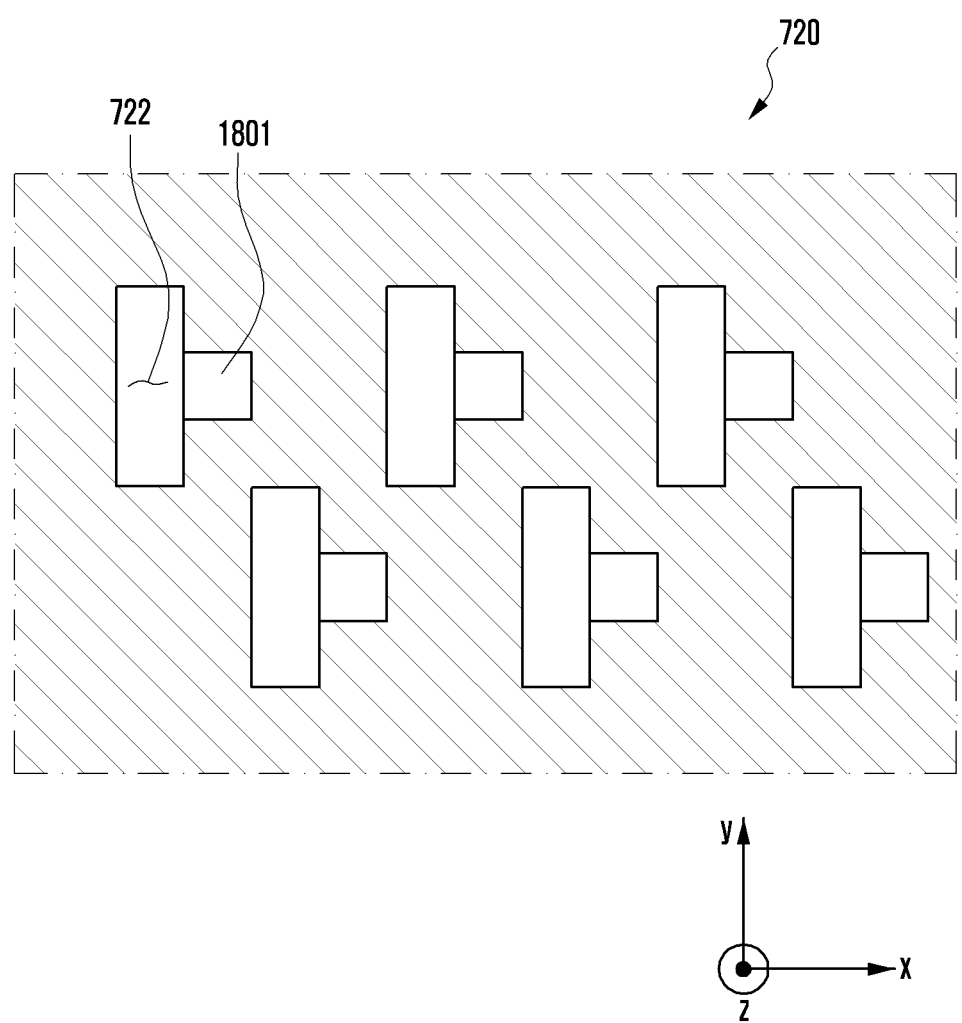
FIG. 16C is a planar view illustrating a second slit having a protrusion 1801 protruding in the +x direction according to another embodiment.

Referring to FIG. 16C, each of the multiple second slits 722 may be disposed to have a bar shape extending in the y direction and a protrusion 1801 protruding from the center of the bar in the +x direction. According to an embodiment, the first metal layer 710 may be formed in a shape identical or similar to the shape of the second metal layer 720 shown in FIG. 16C. For example, although not shown, each of the multiple second slits 722 may be disposed to have a bar shape extending in the y direction and a protrusion (not shown) protruding in the +x direction.

Figure 16D:
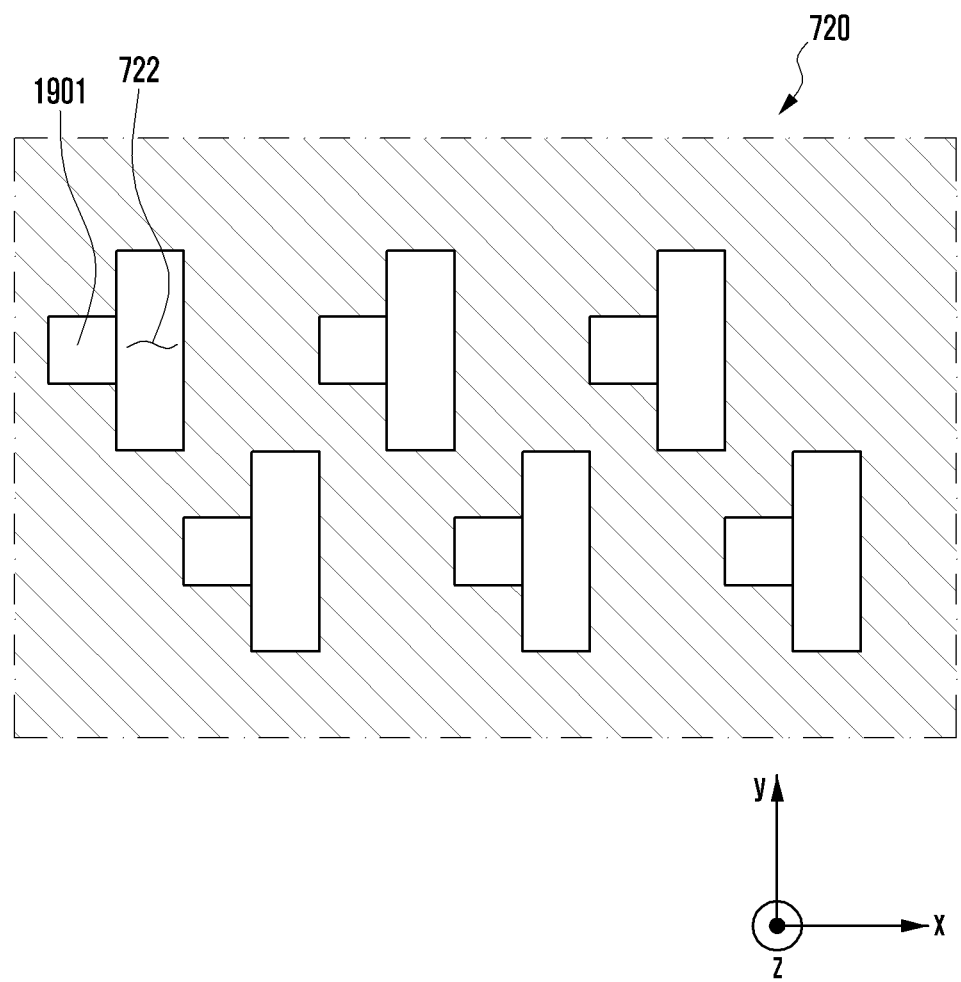
FIG. 16D is a planar view illustrating a second slit having a protrusion 1901 protruding in the −x direction according to another embodiment.

Referring to FIG. 16D, each of the multiple second slits 722 may be disposed to have a bar shape extending in the y direction and a protrusion 1901 protruding from the center of the bar in the −x direction. According to an embodiment, the first metal layer 710 may be formed in a shape identical or similar to the shape of the second metal layer 720 shown in FIG. 16D. For example, although not shown, each of the multiple second slits 722 may be disposed to have a bar shape extending in the y direction and a protrusion (not shown) protruding from the center of the bar in the −x direction.

Figure 16E:
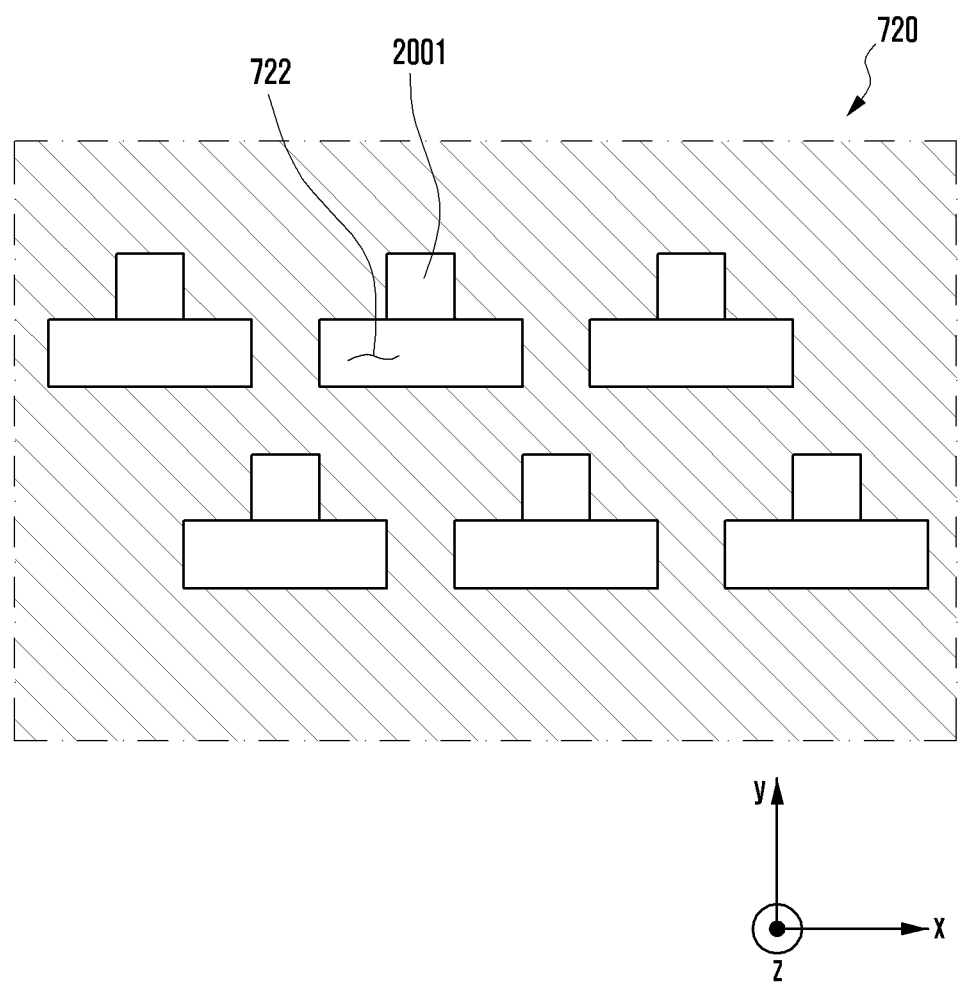
FIG. 16E is a planar view illustrating a second slit having a protrusion 2001 protruding in the +y direction according to another embodiment.

Referring to FIG. 16E, each of the multiple second slits 722 may be disposed to have a bar shape extending in the x direction and a protrusion 2001 protruding from the center of the bar in the +y direction. According to an embodiment, the first metal layer 710 may be formed in a shape identical or similar to the shape of the second metal layer 720 shown in FIG. 16E. For example, although not shown, each of the multiple second slits 722 may be disposed to have a bar shape extending in the x direction and a protrusion (not shown) protruding from the center of the bar in the +y direction.

Figure 16F:
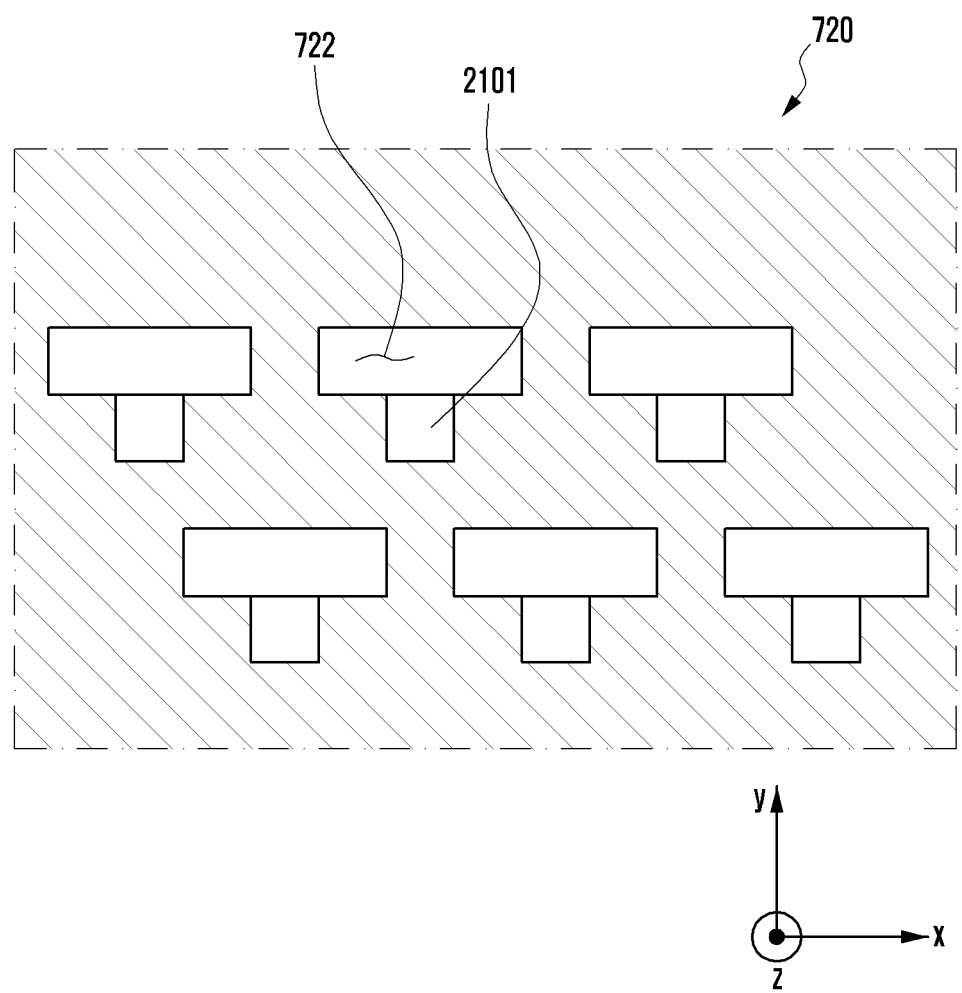
FIG. 16F is a planar view illustrating a second slit having a protrusion 2101 protruding in the −y direction according to another embodiment.

Referring to FIG. 16F, each of the multiple second slits 722 may be disposed to have a bar shape extending in the x direction and a protrusion 2101 protruding from the center of the bar in the −y direction. According to an embodiment, the first metal layer 710 may be formed in a shape identical or similar to the shape of the second metal layer 720 shown in FIG. 16F. For example, although not shown, each of the multiple second slits 722 may be disposed to have a bar shape extending in the x direction and a protrusion (not shown) protruding from the center of the bar in the −y direction.

Figure 16G:
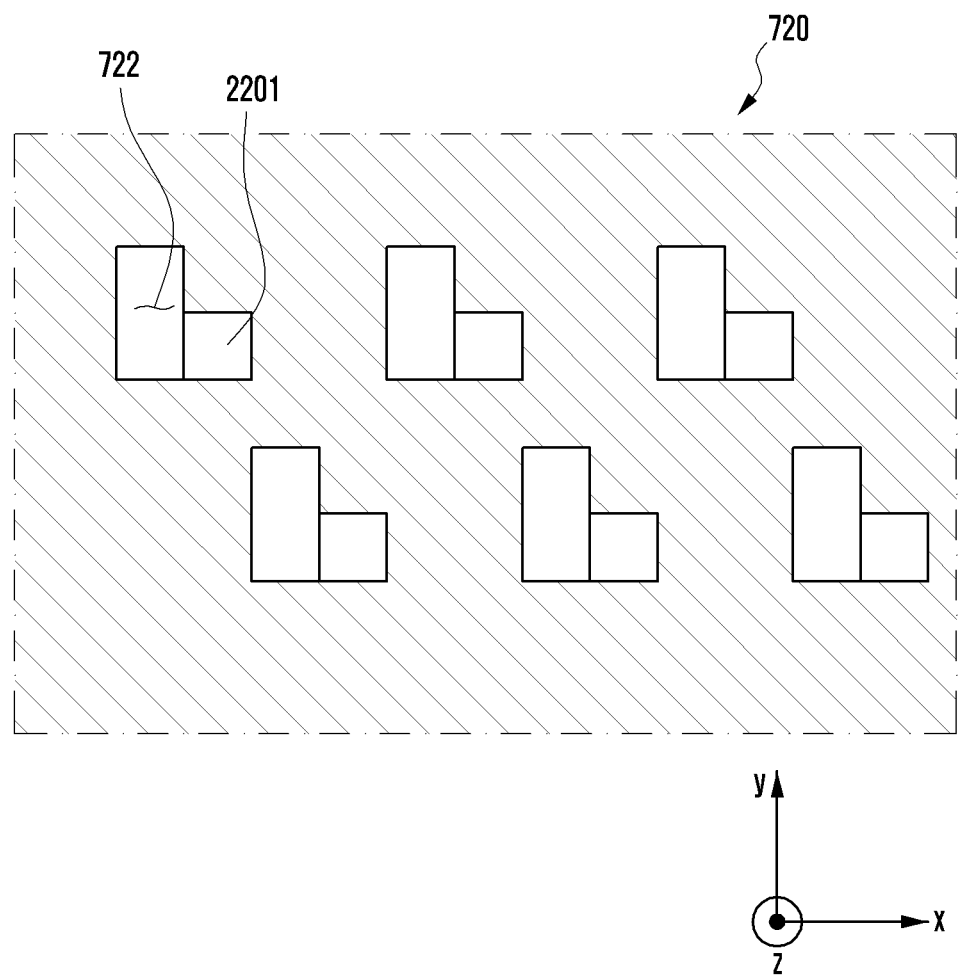
FIG. 16G is a planar view illustrating a second slit having a protrusion 2201 protruding in the +x direction according to another embodiment.

Referring to FIG. 16G, each of the multiple second slits 722 may be disposed to have a bar shape extending in the y direction and a protrusion 2201 protruding from one end of the bar in the +x direction. According to an embodiment, the first metal layer 710 may be formed in a shape identical or similar to the shape of the second metal layer 720 shown in FIG. 16G. For example, although not shown, each of the multiple second slits 722 may be disposed to have a bar shape extending in the y direction and a protrusion (not shown) protruding from one end of the bar in the +x direction.

Figure 16H:
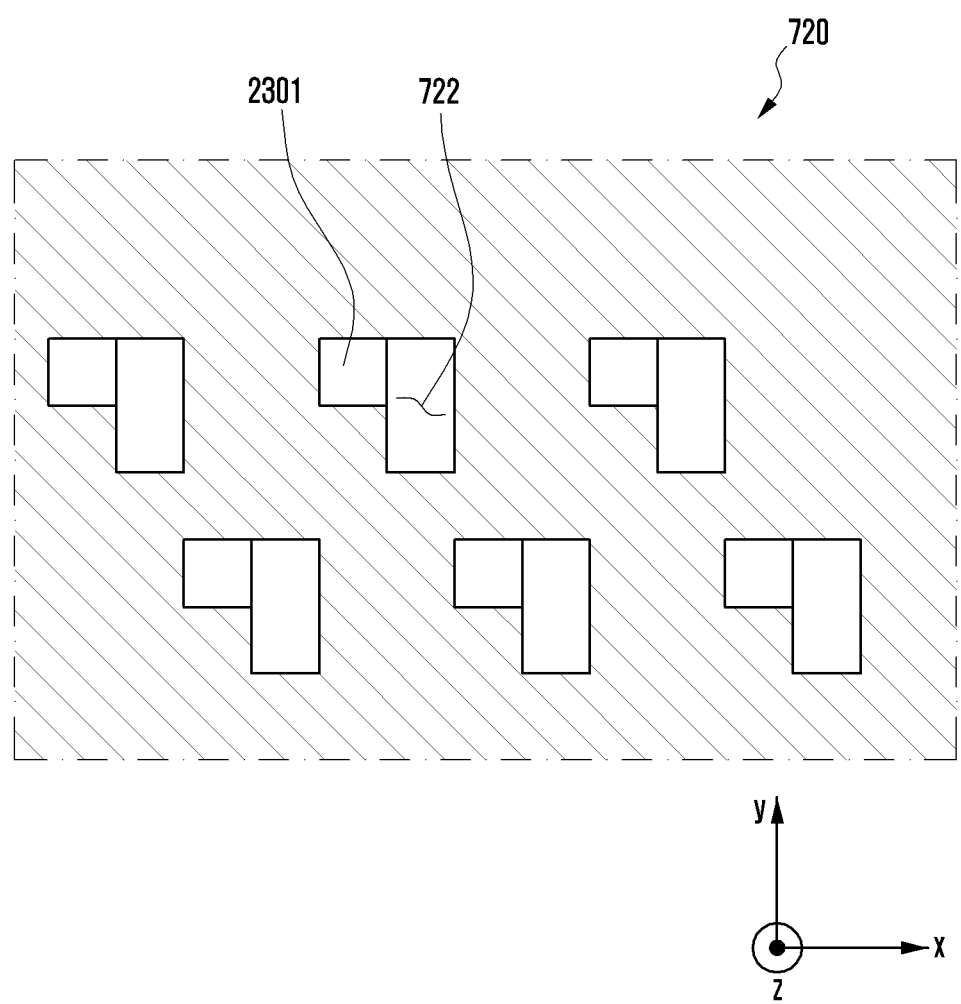
FIG. 16H is a planar view illustrating a second slit having a protrusion 2301 protruding in the −x direction according to another embodiment.

Referring to FIG. 16H, each of the multiple second slits 722 may be disposed to have a bar shape extending in the y direction and a protrusion 2301 protruding from one end of the bar in the −x direction. According to an embodiment, the first metal layer 710 may be formed in a shape identical or similar to the shape of the second metal layer 720 shown in FIG. 16H. For example, although not shown, each of the multiple second slits 722 may be disposed to have a bar shape extending in the y direction and a protrusion (not shown) protruding from one end of the bar in the −x direction.

Figure 16I:
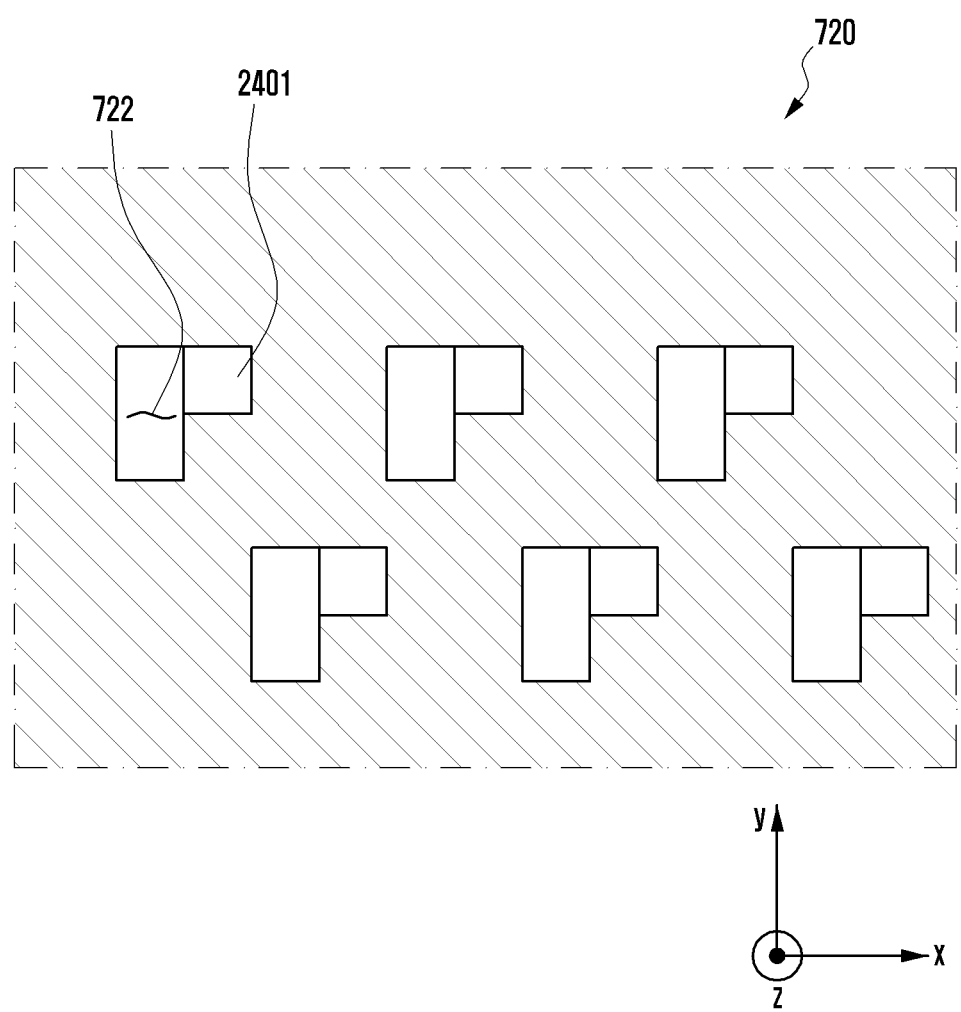
FIG. 16I is a planar view illustrating a second slit having a protrusion 2401 protruding in the +x direction according to another embodiment.

Referring to FIG. 16I, each of the multiple second slits 722 may be disposed to have a bar shape extending in the y direction and a protrusion 2401 protruding from the other end of the bar in the +x direction. According to an embodiment, the first metal layer 710 may be formed in a shape identical or similar to the shape of the second metal layer 720 shown in FIG. 16I. For example, although not shown, each of the multiple second slits 722 may be disposed to have a bar shape extending in the y direction and a protrusion (not shown) protruding from the other end of the bar in the +x direction.

Figure 16J:
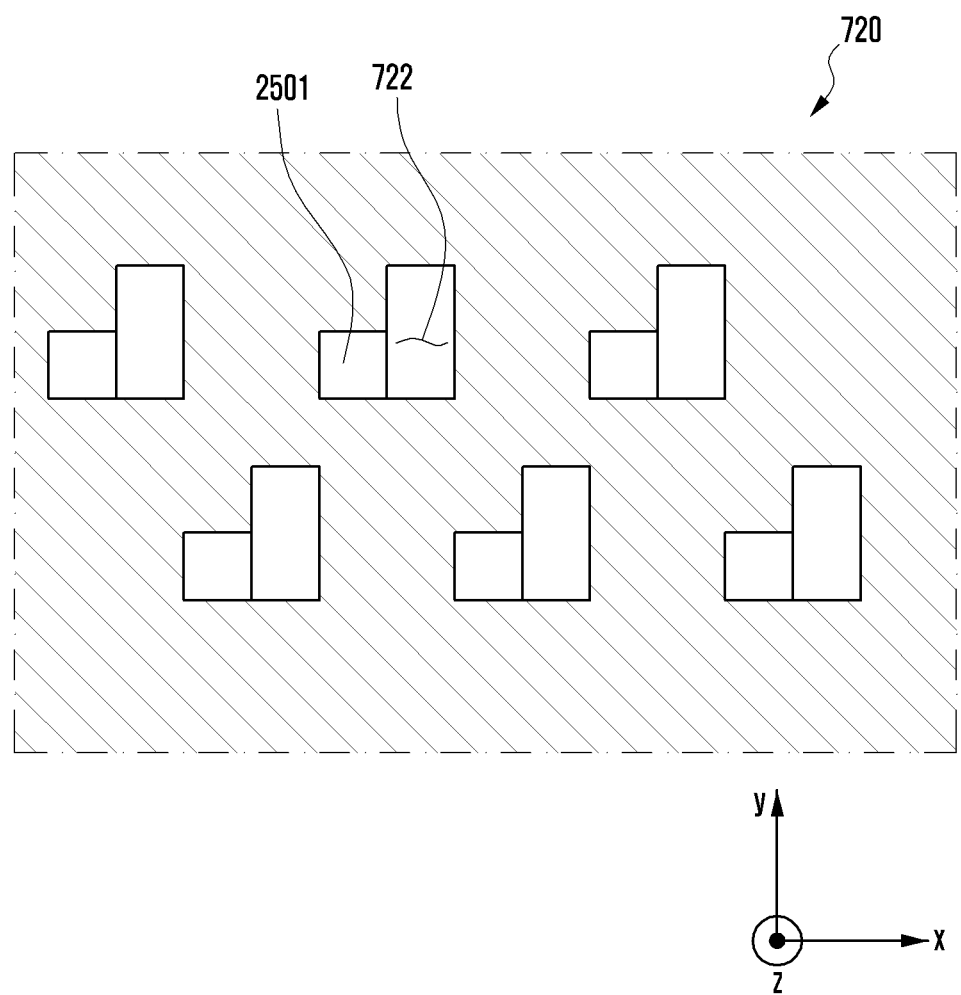
FIG. 16J is a planar view illustrating a second slit having a protrusion 2501 protruding in the −x direction according to another embodiment.

Referring to FIG. 16J, each of the multiple second slits 722 may be disposed to have a bar shape extending in the y direction and a protrusion 2501 protruding from the other end of the bar in the −x direction. According to an embodiment, the first metal layer 710 may be formed in a shape identical or similar to the shape of the second metal layer 720 shown in FIG. 16J. For example, although not shown, each of the multiple second slits 722 may be disposed to have a bar shape extending in the y direction and a protrusion (not shown) protruding from the other end of the bar in the −x direction.

According to certain embodiments, the first shape of the first slit 712 and the second shape of the second slit 722 may be changed and combined into various shapes not shown in the disclosure. For example, the first shape and the second shape may have one shape selected from among the following shapes.

A cross shape;

A bar shape extending in the x direction;

A bar shape extending in the x direction and having a protrusion protruding from the center of the bar in the y direction;

A bar shape extending in the x direction and having a protrusion protruding from the center of the bar in the −y direction;

A bar shape extending in the x direction and having a protrusion protruding from one end of the bar in the y direction;

A bar shape extending in the x direction and having a protrusion protruding from one end of the bar in the −y direction;

A bar shape extending in the x direction and having a protrusion protruding from the other end of the bar in they direction;

A bar shape extending in the x direction and having a protrusion protruding from the other end of the bar in the −y direction;

A bar shape extending in the y direction;

A bar shape extending in the y direction and having a protrusion protruding from the center of the bar in the x direction;

A bar shape extending in the y direction and having a protrusion protruding from the center of the bar in the −x direction;

A bar shape extending in the y direction and having a protrusion protruding from one end of the bar in the x direction;

A bar shape extending in the y direction and having a protrusion protruding from one end of the bar in the −x direction;

A bar shape extending in the y direction and having a protrusion protruding from the other end of the bar in the x direction;

A bar shape extending in the y direction and having a protrusion protruding from the other end of the bar in the −x direction.

The electronic device according to certain embodiments may adjust the remained copper ratio of a second substrate and prevent shifting between a stackable substrate (for example, an interposer) and two substrates (for example, first substrate and second substrate) by forming slits on the second substrate (for example, a sub-substrate or a slave substrate).

The electronic device according to certain embodiments may provide a second substrate having a shielding structure in which multiple ground vias are arranged around slits.

In addition, various effects directly or indirectly identified through the disclosure may be provided.

While the present disclosure has been shown and described with reference to various embodiments thereof, it will be understood by those skilled in the art that various changes in form and details may be made therein without departing from the present disclosure as defined by the appended claims and their equivalents.

The invention claimed is:

1. An electronic device comprising:
   a housing;
   a first substrate disposed in an inner space of the housing and having one or more first electric elements disposed thereon;
   a second substrate disposed in the inner space to be parallel with the first substrate and having one or more second electric elements disposed thereon; and
   a third substrate disposed between the first substrate and the second substrate and configured to electrically connect the first substrate and the second substrate,
   wherein the second substrate is disposed from the first substrate in a first direction, and
   wherein the second substrate includes:
      a first metal layer including a first metal pattern connected to ground and multiple first slits formed by removing a portion of the first metal pattern, each of the multiple first slits having a cross shape,
      a second metal layer disposed in a second direction opposite to the first direction from the first metal layer and including a second metal pattern connected to the ground and multiple second slits formed by removing a portion of the second metal pattern, each of the multiple second slits having the cross shape, and
      multiple ground vias extending through at least a portion of the second substrate so as to connect the first metal pattern of the first metal layer to the second metal pattern of the second metal layer.

2. The electronic device of claim 1, wherein the multiple first slits are arranged in a first matrix form at intervals, and
   wherein the multiple second slits are arranged in a second matrix form at intervals.

3. The electronic device of claim 2, wherein each of the multiple first slits and each of the multiple second slits have the same area.

4. The electronic device of claim 3, wherein each of the multiple first slits further comprises:
   a first portion disposed at a center of each of the multiple first slits;
   a second portion disposed from the first portion in +y direction;
   a third portion disposed from the first portion in −y direction;
   a fourth portion disposed from the first portion in +x direction; and
   a fifth portion disposed from the first portion in −x direction,
   wherein each of the first portion to the fifth portion has a square shape of a first width,
   wherein each of the second slits further comprises:
      a sixth portion disposed at a center of each of the multiple second slits;
      a seventh portion disposed from the sixth portion in +y direction;
      an eighth portion disposed from the sixth portion in −y direction;
      a ninth portion disposed from the sixth portion in +x direction;
      a tenth portion disposed from the sixth portion in −x direction, and
   wherein each of the sixth portion to the tenth portion has the square shape of the first width.

5. The electronic device of claim 4, wherein, when the second substrate is viewed from the first direction, a center of one of the multiple first slits and a center of one of the multiple second slits are arranged to be spaced apart by a length corresponding twice the first width.

6. The electronic device of claim 5, wherein, when the second substrate is viewed from the first direction, the fourth portion of the one of the multiple first slits and the tenth portion of the one of the multiple second slits are arranged to overlap each other, and the fifth portion of the one of the multiple first slits and the ninth portion of the one of the multiple second slits are arranged to overlap each other.

7. The electronic device of claim 6, wherein, when the second substrate is viewed from the first direction, portions of the one of the multiple first slits other than the fourth portion and the fifth portion are arranged to overlap the second metal pattern of the second metal layer, and portions of the one of the multiple second slits other than the ninth portion and the tenth portion are arranged to overlap the first metal pattern of the first metal layer.

8. The electronic device of claim 2, wherein first slits arranged in odd-numbered rows and first slits arranged in even-numbered rows are not arranged in a straight line in y direction but arranged to be shifted from each other.

9. The electronic device of claim 2, wherein second slits arranged in odd-numbered rows and second slits arranged in even-numbered rows are not arranged in a straight line in y direction but arranged to be shifted from each other.

10. The electronic device of claim 1, wherein the multiple ground vias are arranged at both sides of each of the first slits at intervals to connect the first metal pattern and the second metal pattern.

11. An electronic device comprising:
a housing;
a first substrate disposed in an inner space of the housing and having one or more first electric elements disposed thereon;
a second substrate disposed in the inner space to be parallel with the first substrate and having one or more second electric elements disposed thereon; and
a third substrate disposed between the first substrate and the second substrate and configured to electrically connect the first substrate and the second substrate,
wherein the second substrate is disposed from the first substrate in a first direction,
wherein the second substrate comprises:
   a first metal layer including a first metal pattern connected to ground and multiple first slits formed by removing a portion of the first metal pattern, each of the multiple first slits having a first shape,
   a second metal layer disposed in a second direction opposite to the first direction from the first metal layer and including a second metal pattern connected to the ground and multiple second slits formed by removing a portion of the second metal pattern, each of the multiple second slits having a second shape other than the first shape, and
   multiple ground vias extending through at least a portion of the second substrate so as to connect the first metal pattern of the first metal layer to the second metal pattern of the second metal layer, and
wherein, when the second substrate is viewed from the first direction:
   portions of the first metal layer excluding the multiple first slits are arranged to overlap the second metal pattern of the second metal layer, and
   portions of the second metal layer excluding the multiple second slits are arranged to overlap the first metal pattern of the first metal layer.

12. The electronic device of claim 11, wherein the first shape comprises a cross shape, and
wherein the second shape comprises a bar shape.

13. The electronic device of claim 12, wherein two neighboring first slits have the cross shape and are connected to each other.

14. The electronic device of claim 11, wherein the first shape and the second shape is a shape selected from among:
a cross shape,
a bar shape extending in x direction,
a bar shape extending in x direction and having a protrusion protruding from the center of the bar in y direction,
a bar shape extending in x direction and having a protrusion protruding from the center of the bar in −y direction,
a bar shape extending in x direction and having a protrusion protruding from one end of the bar in y direction,
a bar shape extending in x direction and having a protrusion protruding from one end of the bar in −y direction,
a bar shape extending in x direction and having a protrusion protruding from another end of the bar in y direction,
a bar shape extending in x direction and having a protrusion protruding from another end of the bar in −y direction,
a bar shape extending in y direction,
a bar shape extending in y direction and having a protrusion protruding from the center of the bar in x direction,
a bar shape extending in y direction and having a protrusion protruding from the center of the bar in −x direction,
a bar shape extending in y direction and having a protrusion protruding from one end of the bar in x direction,
a bar shape extending in y direction and having a protrusion protruding from one end of the bar in −x direction,
a bar shape extending in y direction and having a protrusion protruding from another end of the bar in x direction, and
a bar shape extending in y direction and having a protrusion protruding from another end of the bar in −x direction.

15. The electronic device of claim 11, wherein the multiple first slits are arranged in a first matrix form at intervals, and
wherein the multiple second slits are arranged in a second matrix form at intervals.

16. The electronic device of claim 11, wherein, when the second substrate is viewed from the first direction, a center of one of the multiple first slits and a center of one of the multiple second slits are arranged to be spaced apart by a predetermined length.

17. The electronic device of claim 15, wherein first slits arranged in odd-numbered rows and first slits arranged in even-numbered rows are not arranged in a straight line in y direction but arranged to be shifted from each other.

18. The electronic device of claim 15, wherein second slits arranged in odd-numbered rows and second slits arranged in even-numbered rows are not arranged in a straight line in y direction but arranged to be shifted from each other.

19. The electronic device of claim 11, wherein the multiple ground vias are arranged at both sides of each of the first slits at intervals to connect the first metal pattern and the second metal pattern.

20. An electronic device comprising:
a housing;
a first substrate disposed in an inner space of the housing and having one or more first electric elements disposed thereon;
a second substrate disposed in the inner space to be parallel with the first substrate and having one or more second electric elements disposed thereon; and
a third substrate disposed between the first substrate and the second substrate and configured to electrically connect the first substrate and the second substrate,
wherein the second substrate is disposed from the first substrate in a first direction,
wherein the second substrate comprises:
   a first metal layer including a first metal pattern connected to ground and multiple first slits formed by removing a portion of the first metal pattern, each of the multiple first slits having a first shape,
   a second metal layer disposed in a second direction opposite to the first direction from the first metal layer and including a second metal pattern connected to the ground and multiple second slits formed by removing a portion of the second metal pattern, each of the multiple second slits having a second shape other than the first shape, and
   multiple ground vias extending through at least a portion of the second substrate so as to connect the first metal pattern of the first metal layer to the second metal pattern of the second metal layer, and
wherein, when the second substrate is viewed from the first direction:

portions of the first metal layer excluding the multiple first slits are arranged to overlap the second metal pattern of the second metal layer, and portions of the second metal layer excluding the multiple second slits are arranged to overlap the first metal pattern of the first metal layer, and wherein the second metal layer is an outermost layer of the second substrate disposed closest to the first substrate in a stacking structure of the second substrate.

* * * * *